(12) United States Patent
Landsberger et al.

(10) Patent No.: US 7,119,656 B2
(45) Date of Patent: Oct. 10, 2006

(54) METHOD FOR TRIMMING RESISTORS

(75) Inventors: Leslie M. Landsberger, Westmount (CA); Oleg Grudin, Montreal (CA); Gennadiy Frolov, Montreal (CA)

(73) Assignee: Microbridge Technologies Inc., Montreal (CA)

( * ) Notice: Subject to any disclaimer, the term of this patent is extended or adjusted under 35 U.S.C. 154(b) by 110 days.

(21) Appl. No.: 10/796,420

(22) Filed: Mar. 10, 2004

(65) Prior Publication Data

US 2004/0207507 A1    Oct. 21, 2004

Related U.S. Application Data

(63) Continuation of application No. PCT/CA02/01366, filed on Sep. 10, 2002.

(60) Provisional application No. 60/317,969, filed on Sep. 10, 2001.

(51) Int. Cl.
*H01C 10/00* (2006.01)

(52) U.S. Cl. .................. 338/195; 338/320; 29/610.1

(58) Field of Classification Search .............. 338/23, 338/195, 306–311, 314, 320; 29/610.1; 257/321; 156/643
See application file for complete search history.

(56) References Cited

U.S. PATENT DOCUMENTS

| 4,041,440 | A | * | 8/1977 | Davis et al. ................ 338/195 |
| 4,210,996 | A | | 7/1980 | Amemiya et al. |
| 4,472,239 | A | | 9/1984 | Higashi et al. |
| 4,606,781 | A | | 8/1986 | Vyne |
| 4,683,442 | A | | 7/1987 | Vyne |
| 4,717,886 | A | | 1/1988 | Davis et al. |
| 4,782,202 | A | | 11/1988 | Endo et al. |
| 4,870,472 | A | | 9/1989 | Vyne |
| 4,902,959 | A | | 2/1990 | Brokaw |
| 5,081,439 | A | * | 1/1992 | Natzle et al. ................ 338/195 |
| 5,110,758 | A | | 5/1992 | Baskett |
| 5,363,084 | A | * | 11/1994 | Swinehart .................... 338/308 |
| 5,460,040 | A | | 10/1995 | Tada et al. |
| 5,466,484 | A | | 11/1995 | Spraggins et al. |
| 5,493,148 | A | | 2/1996 | Ohata et al. |
| 5,557,252 | A | * | 9/1996 | Ariyoshi ..................... 338/195 |
| 5,563,549 | A | | 10/1996 | Shieh |
| 5,635,893 | A | | 6/1997 | Yee et al. |
| 5,679,275 | A | | 10/1997 | Susak et al. |

(Continued)

FOREIGN PATENT DOCUMENTS

EP       1 275 967       1/2003

(Continued)

OTHER PUBLICATIONS

Pulse Current Trimming of Polysilicon Resistors, D.W. Feldbaumer et al., IEEE Transactions on Electron Devices, IEEE, N.Y., USA vol. 42, N° 4, pp. 689-696.

(Continued)

*Primary Examiner*—Tu Hoang
(74) *Attorney, Agent, or Firm*—Ogilvy Renault LLP

(57) ABSTRACT

There is provided a method and circuit for trimming a functional resistor on a thermally isolated micro-platform such that a second functional resistor on the same micro-platform remains substantially untrimmed; a method and circuit for providing and trimming a circuit such that at least two circuit elements of the circuit are subjected to a same operating environment and the operating environment is compensated for by distributing heat generated during operation of the circuit among the two circuit elements; a method and circuit for trimming a functional resistor on a thermally-isolated micro-platform such that a constant temperature distribution is obtained across the functional resistor; and a method and circuit for calculating a temperature coefficient of resistance of a functional resistor.

18 Claims, 11 Drawing Sheets

U.S. PATENT DOCUMENTS

| | | | |
|---|---|---|---|
| 5,742,307 | A | 4/1998 | Watrobski et al. |
| 5,757,264 | A | 5/1998 | Petit |
| 5,844,122 | A | 12/1998 | Kato |
| 6,097,276 | A | 8/2000 | Van Den Broek et al. |
| 6,184,494 | B1 | 2/2001 | Isokoski et al. |
| 6,255,185 | B1 | 7/2001 | Coolbaugh et al. |
| 6,667,683 | B1 * | 12/2003 | Emili et al. .............. 338/195 |
| 2001/0001493 | A1 * | 5/2001 | Iwasaki et al. ............ 257/321 |
| 2002/0033519 | A1 | 3/2002 | Babcock et al. |

FOREIGN PATENT DOCUMENTS

| | | |
|---|---|---|
| JP | 04145602 A * | 5/1992 |
| WO | WO 00/21196 | 4/2000 |
| WO | WO03/023794 | 3/2003 |

OTHER PUBLICATIONS

Dopant Segregation in Polycrystalline Silicon, Mandurah et al., Journal Appl. Phys. 51(11), Nov. 1980, pp. 5755-5763.

Spin-on Nanoparticle Tin Oxide for Microhotplate Gas Sensors, R.E. Cavicchi et al. Sensor and Actuators B. Elsevier Sequoia, S.A. Lausanne, CH, vol. 77, No. 1-2, Jun. 15, 2001, pp. 145-154.

A characterization of the Thermal Parameters of Thermally Driven Polysilicon Microbridge Actuators Using Electrical Impedanc Analysis, Jae-Youl Lee et al., Sensors and Actuators A., Elsevier Sequoia S.A., Lausanne, CH. vol. 75, No. 1, May 4, 1999, pp. 86-92.

Fabrication of Thermal-Isolation Structure for Microheater Elements Applicable to Fingerprint Sensors, Hans Ji-Song et al., Sensors and Actuators A., Elsevier Sequoia S.A., Lausanne, CH, vol. 100, No. 1, Aug. 15, 2001, pp. 114-122.

Constant Voltage Trimming of Heavily Doped Polysilicon Resistors, Japan Journal Appl. Phys. vol. 34, Part 1, No. 1, Jan. 1995, pp. 48-53.

Pulse Current Trimming of Polysilicon Resistors, Transactions of Electron Devices, IEEE, vol. 42, N° 4, Apr. 1995, pp. 689-695.

Change in Temperature Coefficient of Resistance of Heavily Doped Polysilicon Resistors Caused by Electrical Trimming, Japan Journal Appl. Phys, vol. 35, Part 1, No. 8, Aug. 1995, pp. 4209-4215.

Theory and Application of Polysilicon Resistor Trimming, Solid-State Electronics, vol. 38, N° 11. 1995, pp. 1861-1869.

Electrical Trimming of Ion-Beam Sputtered Polysilicon Resistors by High Current Pulses, IEEE Transactions on Electron Devices, vol. 41, No. 8, Aug. 1994, pp. 1429-1434.

Electrical Trimming of Heavily Doped Polycrystalline Silicon Resistors, IEEE Transactions on Electron Devices, Vo. ED-26, No. 11, Nov. 1979, pp. 738-742.

A Monolithic 14Bit D/A Converter Fabricated with a New Trimming Technique (DOT), IEEE, Journal of Solid-State Circuits, vol. SC-19, N° 5, Oct. 1984, pp. 802-807.

Precision Electrical Trimming of Very Low TCR Poly-SiGe Resistors, IEEE Electron Device Letters, Bol. 21, No. 6, Jun. 2000, pp. 283-286.

1/F Noise Transformation that Accompanies the Trimming of Polycrystalline Silicon Layers, Solid State Phenomena, vols. 51-52 (1996) Scitec Publications, Switzerland, pp. 391-396.

Micromachined Thermal Radiation Emitter from a Commercial CMOS Process,IEEE Electron Devices Letters, vol. 12, No. 2, Feb. 1991, pp. 57-59.

CMOS-Compatible High-Temperature Micro-Heater: Microstructure Release and Testing, Can. J. Elect & Comp. Eng., vol. 25, No. 1, Jan. 2000, pp. 002-006.

Reliability Study of Polysilicon for Microhotplates, 1994, Dept. of Electrical and Computer Engineering, N.R. Swart et al., University of Waterloo, Waterloo, Ont. CANADA, pp. 119-122.

CMOS Thermally Isolated Heater Structure as a Substrate for Semiconductor Gas Sensors, S. Wessel et al, Energy Research Institute, pp. 1.6.1 to 1.6.8.

A Microstructure for Measurement of Thermal Conductivity of Polysilicon Thin Films, Friedemann Völklein et al., Jour. of Microelectromechanical Systems, vol. 1, N° 4, Dec. 1992, pp. 193-196.

Electrical and Optical Characteristics of Vacuum-Sealed Polysilicon Microlamps, Carlos H. Mastrangelo et al., IEEE Transactions on Electron Devices, vol. 39, N° 6, Jun. 1992, pp. 1363-1374.

* cited by examiner

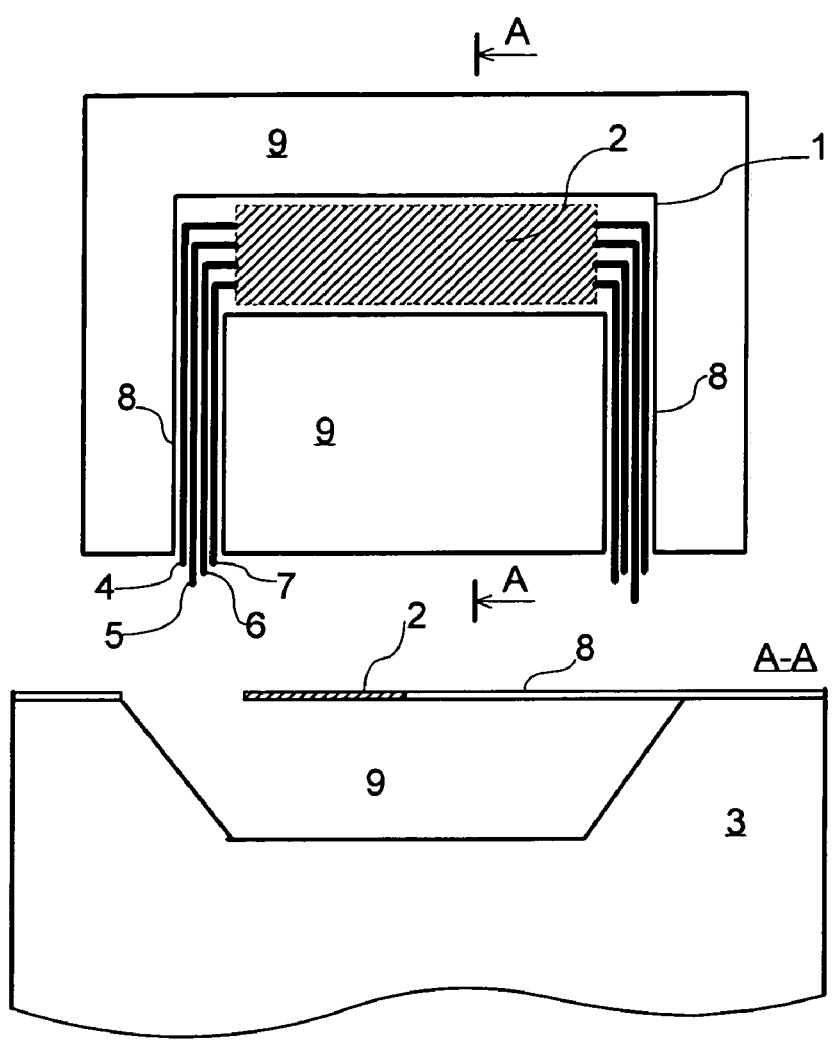

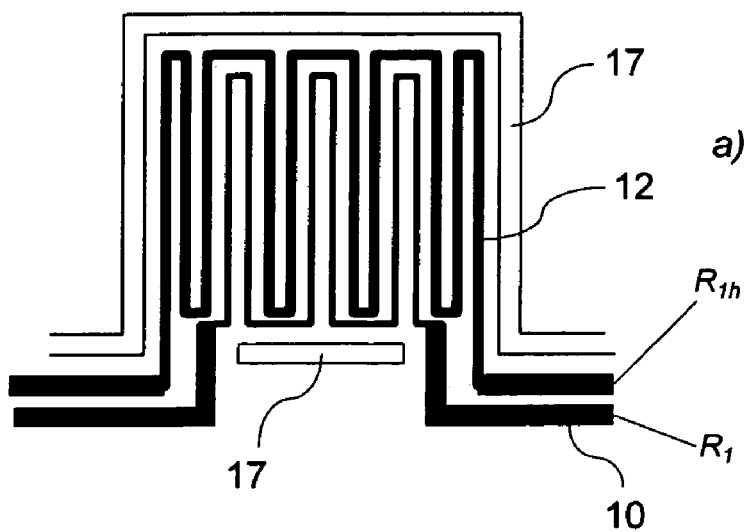
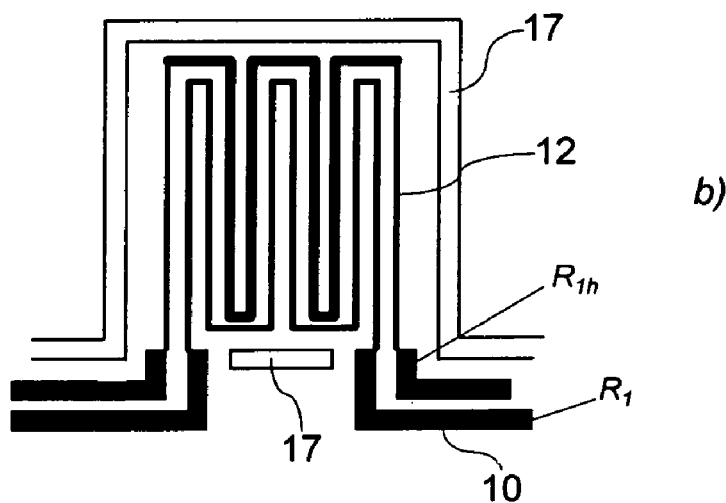
*Fig. 12*
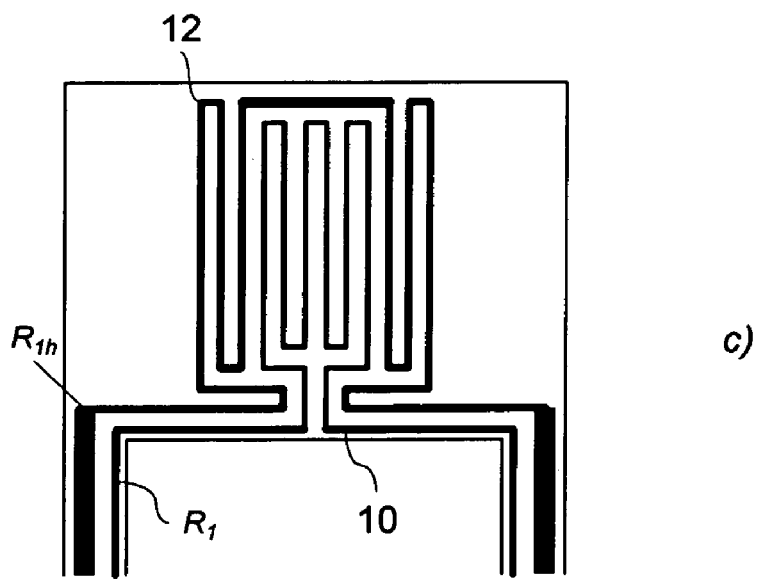

operating mode
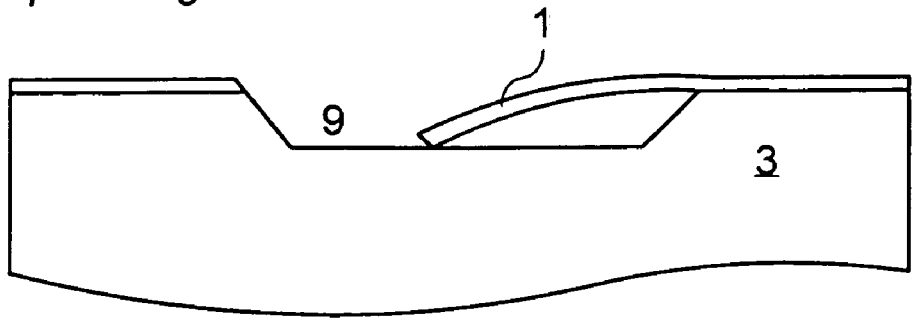
trimming mode
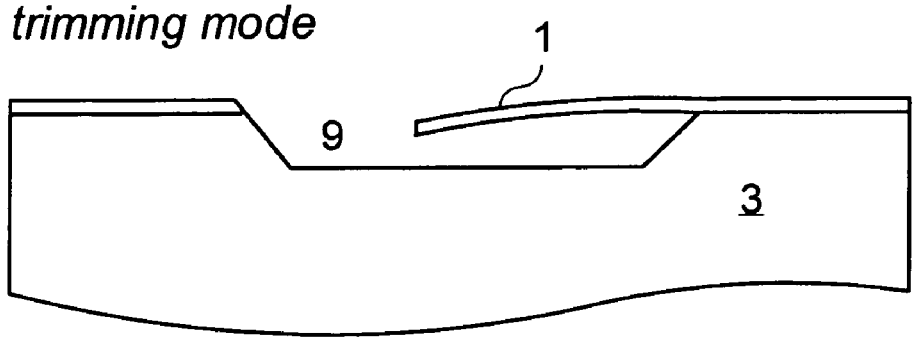
Fig. 13
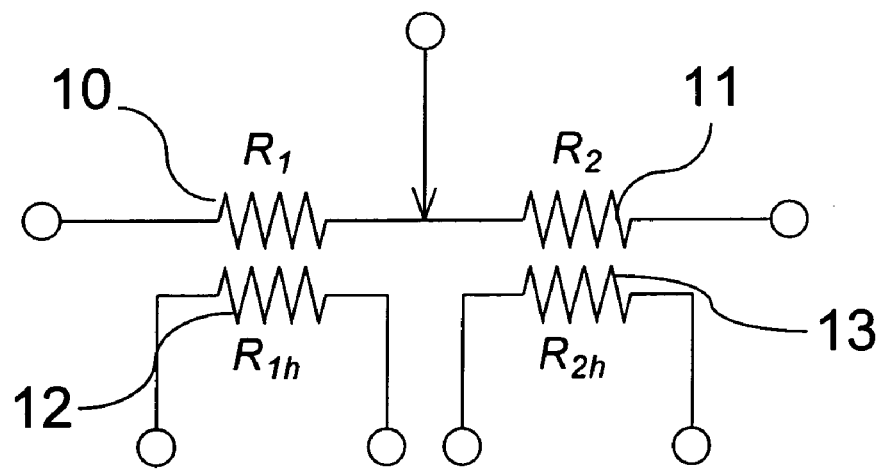
Fig. 14

METHOD FOR TRIMMING RESISTORS

CROSS-REFERENCE TO RELATED APPLICATIONS

The present application is a continuation of PCT application PCT/CA02/01366 filed on Sep. 10, 2002 designating the United States of America and currently pending, which also claims priority of US provisional application No. 60/317,969, filed on Sep. 10, 2001.

FIELD OF THE INVENTION

The invention relates to the trimming of a resistor or resistors, suitable for use at any level of the manufacturer-to-user chain. More specifically, it relates to trimming by resistive heating using electric current in the resistor itself or in an adjacent resistor.

BACKGROUND OF THE INVENTION

The trimming (adjustment) of resistors is a widely used procedure in the manufacture of microelectronics and electronic components, and in common design of user circuits, especially where precision calibration is desired. In principle, one trims the resistor until an observable local or global circuit parameter reaches a desired value. Resistor trimming is widespread in both manufacturing of a variety of components and instruments, and in the user community.

Several methods exist for trimming resistors, applicable at various levels of the manufacturer-to-user chain, including laser-trimming, electrical trimming, trimming by reconfiguration of resistor networks using fuses, and the use of trimpots (potentiometers) having variable numbers of resistive turns.

Electro-thermal trimming phenomena have been observed by several authors, for the trimming of a variety of resistor materials. For example, Kato and Ono ("Constant Voltage Trimming of Heavily-Doped Polysilicon Resistors," Jpn. J. Appl. Phys. Vol. 34, 1995, pp. 45–53), related experimental results to a theoretical model, whereby the instability of polysilicon as a function of applied voltage and current were explained by melting-segregation at grain boundaries in the polysilicon, modified by the temperature dependence of grain resistance. In their formulation, the resistance behavior is found to be highly non-linear, with little or no change in resistance for low power dissipation (below a certain threshold), and dramatically increased instability above a certain threshold. Also, research at Motorola by D. Feldbaumer, J. Babcock, ("Theory and Application of Polysilicon Resistor Trimming", Solid-State Electronics, 1995, vol. 38, pp. 1861–1869) prove that polysilicon resistors, so-trimmed at higher temperature(s), exhibit excellent stability in absolute resistance, during operation at or near room temperature.

The thermal instability, (unstable resistance variation with temperature) of polysilicon resistors located on micro-machined platform suspended over cavities, is known (Canadian Microelectronics Corporation Report #IC95-08 September 1995; and O. Grudin, R. Marinescu, L. M. Landsberger, D. Cheeke, M. Kahrizi, "CMOS-Compatible High-Temperature Micro-Heater: Microstructure Release and Testing," Canadian Journal of Elec. and Comp. Engineering, 2000, Vol.25, No.1, pp. 29–34.) It is known that, for a resistance element on a micro-platform, the resistance could be increased or decreased depending on the power applied through that resistance element. This is usually considered to be a disadvantage for the use of polysilicon for resistive elements where stability is important. This present invention concerns the use of this instability (or any similar threshold-dependent instability in resistive materials), to overcome any of a group of several obstacles present in the aggregate of the prior art. In particular, the material should be stable below a certain threshold of temperature or power dissipation, and relatively less stable above such a threshold, such that its resistance can be modified.

There exists electrical trimming of metal resistors based on inducing electro-migration in the resistive elements by pulsing high currents (U.S. Pat. Nos. 4,870,472, 4,606,781). This method relies on very high current density to cause the electro-migration.

There exists electrical trimming based on thermally-induced changes in resistivity of polysilicon resistors residing on a substrate (U.S. Pat. No. 4,210,996; D. Feldbaumer, J. Babcock,. V. Mercier, C. Chun, "Pulse Current Trimming of Polysilicon Resistors", IEEE Trans. Electron Devices, 1995, vol. 42, pp. 689–695; D. Feldbaumer, J. Babcock, "Theory and Application of Polysilicon Resistor Trimming", Solid-State Electronics, 1995, vol. 38, pp. 1861–1869), or resistors made from other thermally-mutable types of materials). This method relies on the application of highly dissipated power (such as several watts), to sufficiently heat the resistors while they are on the substrate which effectively acts as a heat-sink. This in turn requires high voltage and brings the danger of damage from electrostatic discharge (ESD).

Arguably in large part to get around this problem, Motorola invented thermal trimming of a functional resistor by an auxiliary resistor which is electrically-isolated from the functional resistor. This allows functional trimming to set a parameter of a larger circuit (U.S. Pat. Nos. 5,679,275, 5,635,893, 5,466,484), with the trimmable resistor as a component, without repeated disconnection-reconnection of the functional resistor. This also allows the trimming of resistors having high resistance values, without extra constraints on the heater resistor.

The Motorola invention involves placing the resistors one over the other, separated by a very thin electrically-insulating film. This configuration is required principally because the two resistors are situated on the substrate, which acts as a heat sink. Thus, a substantial amount of power is required to be dissipated to attain the trimming temperature. Consequently, the one-over-the-other configuration is preferred in the prior art, in order to maximize the heat transferred from the heater-resistor to the functional-resistor. Any other configuration, such as side-by-side and made from the same deposited layer, would require much higher power-dissipation in the heater-resistor, which in turn would require a higher supply voltage and would unduly heat the substrate. It should be noted that the substantial power dissipated in the heater resistor must be conducted away through the insulating oxide, functional resistor, and other surrounding layers and devices.

The concept of a micro-platform or microstructure suspended over a cavity in a substrate (such as a cavity micro-machined in silicon), including electrically-resistive elements for heating and/or sensing, has been well-known in the literature for a decade or more (Canadian Microelectronics Corporation Report #IC95-08 September 1995; F. Volklein and H. Baltes, "A Microstructure for Measurement of Thermal Conductivity of Polysilicon Thin Films", J. Microelectromechanical Systems, Vol.1, No.4, December 1992, p. 193, and references therein; Y. C. Tai and R. S. Muller, "Lightly-Doped Polysilicon Bridge as an Anemometer," Transducers '87, Rec. of the 4th International Conference on Solid-State Sensors and Actuators 1987, pp. 360–363; N. R. Swart and A. Nathan, "Reliability Study of Polysilicon for Micro-hotplates," Solid State Sensor and Actuator Workshop, Hilton Head, Jun. 13–16, 1994, pp. 119–122.). Micro-platforms with embedded resistive elements are commonly seen in micro-sensor, micro-actuator and micro-electromechanical systems (MEMS) literature since 1990 or earlier (e.g. I. H. Choi and K. Wise, "A Silicon-Thermopile-Based Infrared Sensing Array for Use in Automated Manufacturing," IEEE Transactions on Electron Devices, vol. ED-33, No.1, pp. 72–79, January 1986).

The concept of using a resistive heater to heat an entire suspended micro-platform or microstructure is also well-known in the literature for at least approximately a decade (C. H. Mastrangelo, J. H.-L. Yeh, R. S. Muller, "Electrical and Optical Characteristics of Vacuum-Sealed Polysilicon Micro-lamps", IEEE Trans. Electron. Dev., vol.39, No.6, June 1992, pp. 1363–1375; N. R. Swart, and A. Nathan, "Reliability of Polysilicon for Micro-plates," Solid-State Sensor and Actuators Workshop, Hilton Head, South California, Jun. 13–16, 1994, pp. 119–122; S. Wessel, M. Parameswaran, R. F. Frindt, and R. Morrison, "A CMOS Thermally-isolated Heater Structure as Substrate for Semiconductor Gas Sensors," Microelectronics, Vol.23, No.6, September 1992, pp. 451–456; M. Parameswaran, A. M. Robinson, Lj. Ristic, K. C. Chau, and W. Allegretto, "A CMOS Thermally Isolated Gas Flow Sensor," Sensors and Materials, 2, 1, (1990), pp. 17–26.)

University of Michigan has patented (U.S. Pat. No. 6,169,321), the thermally-induced modification of parameters such as resonance frequency and Q of micro-machined resonators and other micro-structures residing on a micro-platform, using a separate micro-heater, also on the micro-platform.

Thermal trimming of a thermo-anemometer-type of sensor (such as a thermal accelerometer) is known (U.S. Pat. No. 5,808,197), where temperature-sensitive metal resistors are heated until they oxidize, hence changing the resistance of the metal film. This procedure is not reversible, and can be used only at the manufacturing stage (not practical for user- or field-trimming).

A method of creating a precise resistance having little-to-no drift with temperature (so-called "zero-TCR"), based on combination (connection) of two resistors having positive and negative temperature coefficients of resistance (TCR's), with subsequent laser trimming, has also been invented (U.S. Pat. No. 6,097,276). The method involves calibration steps wherein the resistor is heated up to a predetermined temperature (T), then the T-induced resistance drift is measured, then the structure is laser-trimmed to minimize net TCR of the combined resistor, and then the process is repeated until the TCR is reduced to the desired level.

The inclusion of trimmable resistors in certain devices and applications has also been considered in prior inventions (U.S. Pat. Nos. 5,679,275, 5,635,893, 5,466,484). In particular, the use in op amps, in reference voltage sources, and in digital-to-analog convertors and analog-to-digital convertors (DAC/ADC's) has been outlined (U.S. Pat. Nos. 5,679,275, 5,635,893, 5,466,484.)

There is a need for highly accurate trimming that can exceed the accuracy achieved by laser trimming and does not require special equipment such as powerful lasers.

SUMMARY OF THE INVENTION

Accordingly, an object of the present invention is to perform effective trimming of functional resistors made from unstable material, wherein the trimming behavior depends sensitively on temperature above a certain threshold, by obtaining a temperature relatively constant with time in the targeted element, and by obtaining a relatively flat spatial temperature profile in the targeted element. This should lead to the effective trimming of resistors in a wider range of devices, and in a wider range of circumstances, and the enabling of practical user-trimming and field-trimming of applications devices such as resistor dividers, trimpots, resistor networks, op-amps, instrumentation op-amps, reference voltage sources, DAC/ADC's, signal conditioning circuits, programmable-gain amplifiers, piezoresistors, and sensors.

It is also an object of the present invention to independently trim functional elements, such as resistors, while maintaining them in close thermal contact.

It is also an object of the present invention to reduce the amount of power needed to accomplish trimming.

It is also an object of the present invention to trim a functional element, such as a resistor, wherein a desired output signal depends critically on the interactive response of at least two functional independently trimmable elements.

According to a first broad aspect of the present invention, there is provided a method for trimming a functional resistor, the method comprising: providing a thermally-isolated micro-platform on a substrate; placing a plurality of thermally-trimmable functional resistors on the thermally-isolated micro-platform; subjecting a portion of the thermally-isolated micro-platform to a heat pulse such that a resistance value of one of said plurality of functional resistors is trimmed while a resistance value of remaining ones of said plurality of functional resistors remains substantially untrimmed.

Preferably, pulse-heating is intended to heat a sub-region of the thermally-isolated plate. Here, it is intended for the heat dissipation (or the bulk of the heat dissipation) to be localized within a relatively small portion (containing the heat-targeted region or regions, which may be areas or volumes) of a thermally-isolated plate without affecting other elements on the plate. Four types of pulses (steady-state square pulse, quasi-static square pulse, dynamic square pulse, and dynamic shaped pulse) are to be used in this particular mode (heating a sub-region of the thermally-isolated plate)."

In addition to this mode, the other two potential heat localization modes relative to heat dissipation in the zones surrounding the heat-targeted regions are the "sub-region on substrate" and the "thermally-isolated plate". In the sub-region on substrate, it is intended for the heat dissipation (or the bulk of the heat dissipation) to be localized within a sub-region (containing the heat-targeted region) of a device, where that sub-region is simply located on a substrate, usually a semiconductor substrate. The heat-targeted region may be directly on the substrate, or supported or separated from the main substrate by thin films, which may be insulating. In the thermally-isolated plate, it is intended for the heat dissipation (or the bulk of the heat dissipation) to be localized within a relatively thermally-isolated plate containing the heat-targeted region. The plate is relatively well thermally isolated from a main substrate, usually a semiconductor substrate. One way to accomplish this thermal isolation is to make the plate suspended over a cavity in the substrate. The plate may often be composed of various layers, such as insulators or conductors or semiconductors, as long as the overall thermal isolation is substantial. Essentially, all three heat localization modes can be used with a dynamic shaped pulse.

According to a second, broad aspect of the present invention, there is provided a method for providing and trimming a circuit, the method comprising: providing at least one thermally-isolated micro-platform on a substrate; placing at least two resistive elements with non-zero temperature induced drift on said at least one thermally-isolated micro-platform, such that said at least two resistive elements on said at least one micro-platform are subjected to a substantially same operating environment, at least one of said at least two resistive elements on said at least one micro-platform being thermally trimmable; trimming said at least one resistive element on said at least one micro-platform to trim said circuit by thermal cycling; connecting said at least two resistive elements together in said circuit in a manner to compensate for said operating environment on said at least one micro-platform; wherein heat generated during operation on the at least one micro-platform is distributed among said at least two resistive elements such that temperature drift is substantially compensated.

According to a third broad aspect of the present invention, there is provided a method for trimming a functional resistor, the method comprising: providing a thermally-isolated micro-platform on a substrate; placing a functional resistor on said thermally-isolated micro-platform; subjecting said functional resistor to a heat source having a power dissipation geometry adapted to obtain a substantially constant temperature distribution across said functional resistor when a temperature of said functional resistor is raised for trimming purposes; and trimming said functional resistor using at least one heat pulse.

According to a fourth broad aspect of the present invention, there is provided a circuit for trimming a functional resistor, the circuit comprising: a plurality of functional resistors thermally-isolated on a substrate; and trimming circuitry for subjecting a portion of the substrate to heat pulses such that a resistance value of one of said plurality of functional resistors is trimmed while a resistance value of remaining ones of said plurality of functional resistors remains substantially untrimmed.

Preferably, the circuit comprises a thermally-isolated micro-platform on the substrate and the plurality of functional resistors are placed on the thermally-isolated micro-platform.

According to a fifth broad aspect of the present invention, there is provided a circuit for trimming circuit elements, the circuit comprising: at least two resistive elements with non-zero temperature induced drift thermally isolated on a substrate, such that said at least two resistive elements are subjected to a substantially same operating environment, at least one of said at least two resistive elements being thermally trimmable; and trimming circuitry for thermally trimming said at least one of said at least two resistive elements; wherein said at least two resistive elements are connected together in said circuit in a manner to compensate for said operating environment, and heat generated is distributed among the at least two circuit elements such that an effect of temperature drift is compensated.

Preferably, at least one thermally-isolated micro-platform is provided and the at least two resistive elements are placed on the thermally-isolated micro-platform.

According to a sixth broad aspect of the present invention, there is provided a circuit for trimming a functional resistor, the circuit comprising: a functional resistor on substrate subject to a heat source having a power dissipation geometry adapted to obtain a substantially constant temperature distribution across said functional resistor when a temperature of said functional resistor is raised for trimming purposes; and trimming circuitry for trimming the functional resistor.

Preferably, the circuit comprises a thermally-isolated micro-platform on the substrate and functional resistor is placed on the thermally-isolated micro-platform.

According to a seventh broad aspect of the present invention, there is provided a method for calculating a temperature coefficient of resistance of a functional resistor, the method comprising: providing at least one thermally-isolated micro-platform on a substrate; placing a functional resistor on said at least one thermally-isolated micro-platform; heating said functional resistor; measuring a resistance value of said functional resistor at ambient temperature and at an elevated temperature; and calculating said temperature coefficient of resistance based on said measured resistance values.

According to an eighth broad aspect of the present invention, there is provided a circuit for calculating a temperature coefficient of resistance of a functional resistor, the circuit comprising: a functional resistor thermally-isolated on a substrate; heating circuitry for heating said functional resistor; measuring circuitry for measuring a resistance value of said functional resistance at ambient temperature and at an elevated temperature; and calculating circuitry for calculating said temperature coefficient of resistance based on said resistance value at ambient temperature and at an elevated temperature.

Preferably, at least one thermally-isolated micro-platform is provided on the substrate and the functional resistor is placed on the at least one thermally-isolated micro-platform.

BRIEF DESCRIPTION OF THE DRAWINGS

These and other features, aspects and advantages of the present invention will become better understood with regard to the following description and accompanying drawings wherein:

FIG. 2 is a top view schematic of a possible configuration of the micro-platform with four resistors, suspended over a cavity;

FIG. 3 is a cross-sectional view of the structure shown in FIG. 2;

FIG. 12 shows three examples of layouts intended to dissipate more power at the edges of the heat-targeted region;

FIG. 13 is an example of a configuration allowing time-varying thermal isolation;

FIG. 14 shows the electrical schematic of two functional resistors, and two heating resistors electrically isolated from the functional resistors;

DETAILED DESCRIPTION OF THE PREFERRED EMBODIMENT

Figure 1:
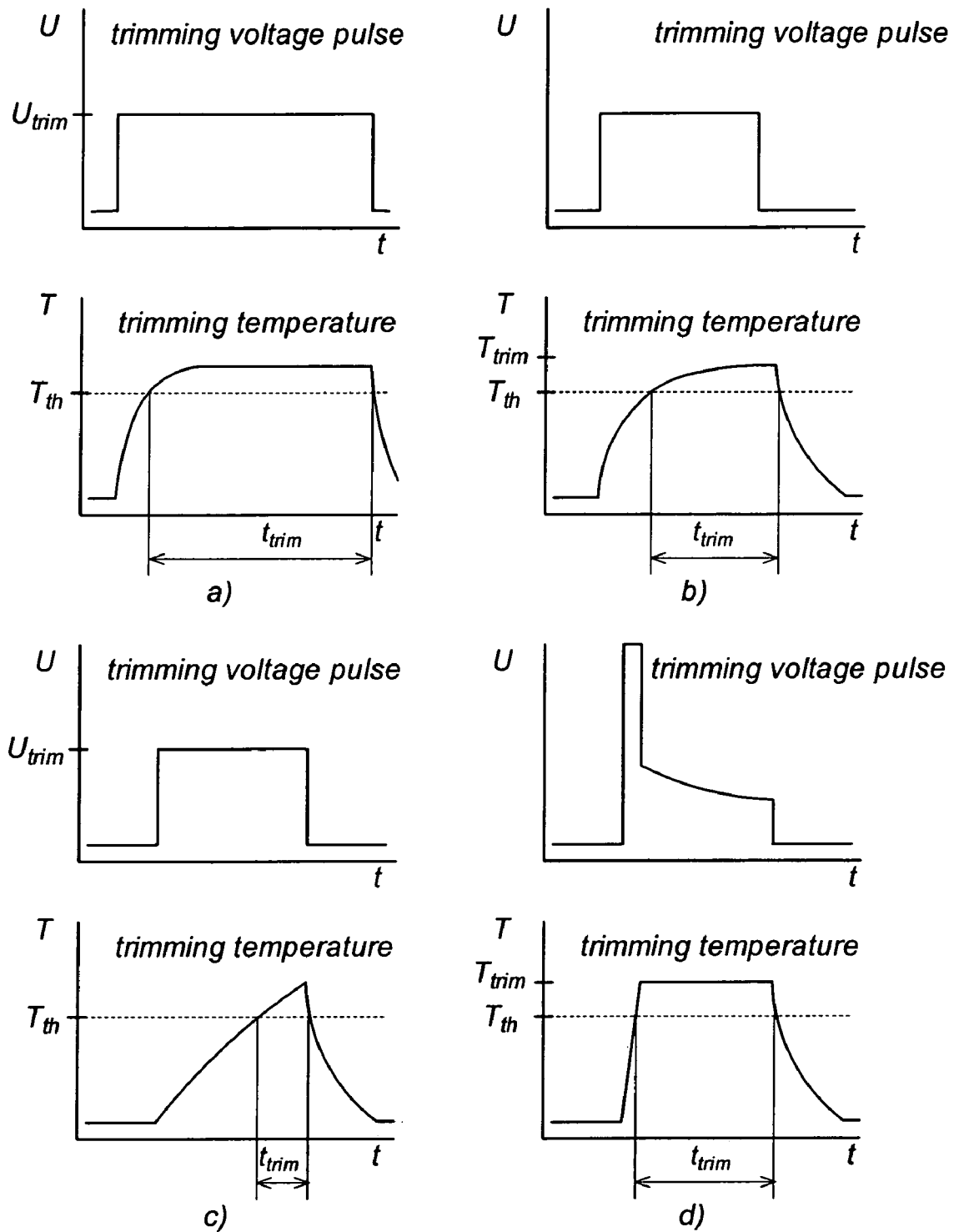
FIG. 1 depicts graphs of temperature vs. time, illustrating different pulse heating modes relative to the temperature attained in the heat-targeted region.

It should be noted that for the purpose of this disclosure, trimming is to be understood as increasing or decreasing the room-temperature resistance value of a resistor. It should also be noted that thermally-isolated is meant to describe an element that is isolated from other elements such that the heat flux (proportional to temperature differential) generated between the element and other elements, is generally low. Electrically-isolated is meant to describe an element that is isolated from other elements such that the resistance between this element and other elements is very high (e.g. hundreds of k-ohms). The term signal is meant to describe any data or control signal, whether it be an electric current, a light pulse, or any equivalent. Furthermore, obtaining a constant or flat temperature distribution, T(x), is equivalent to a relatively flat or substantially constant temperature distribution across a resistor. The entire resistance cannot be at the same temperature since a portion of the resistor must be off the micro-platform (due to the continuous nature of resistors) and electrical contacts must be at a lower temperature. Therefore, obtaining a substantially constant temperature distribution across a resistor is understood to mean across a maximum possible fraction of the resistor. A pulse is to be understood as a short duration of current flow.

To underlie the invention herein, an outline and discussion of certain modes of heating and heat localization is in order. Thermal and electro-thermal trimming of a resistor involves the application of heat to a target resistor for a certain time-period. Thus, almost by definition, all such purposeful trimming is done by a heat pulse or pulses. If the behavior of the resistor is well-known and highly predictable, effective trimming can be done with a single well-designed pulse. If not, or if greater precision is desired, an adaptive series of pulses can be applied. In general, such pulses may have simple shape (e.g. square), or more complicated shape, depending on the desired variation of heating behavior with time.

Also, since such trimming usually targets a particular resistive element localized in a certain sub-volume or sub-area of a larger (usually integrated) device, (which usually must maintain its operating temperature within certain narrow ranges), the localization of the heat in and around the target elements may be of considerable importance. Specifically, the time-variation and spatial variation of heating in the target element(s) may be very important in the attainment of the desired trimming result, which will be strongly influenced by the combination of pulse and heat localization characteristics.

These will be particularly important in light of the highly non-linear nature of trimming. For example, both the degree of trimming and whether the resistance of a resistive element is increased or decreased (trimmed up vs. down), may depend very sensitively on the actual instantaneous temperature of the resistive element. Thus, accurate and efficient trimming may depend critically on very precise control of the time- and spatial variation of the heating, and therefore on pulse and heat localization modes. A range of cases are of particular interest in this invention, outlined and discussed below.

The situation depicted in FIG. 1.a is when a square pulse is used and the heat-targeted element attains thermal steady-state with the surroundings for a substantial portion of the pulse (e.g. within 2% for greater than 90% of the pulse duration). While the spatial profile may vary with position within or surrounding the heat-targeted region, this T(x) profile becomes constant with time, after an initial transient, $\Delta t_{ss}$, which is substantially shorter than the duration of the square pulse, $\Delta t_p$. This type of pulse is called a steady-state square pulse.

The situation depicted in FIG. 1.b is again a square pulse, and the heat-targeted region attains some measure of equilibration with the surroundings, within some more-relaxed factor like 10% of the steady-state value, for some significant fraction (e.g. ½) of the pulse duration. This is a similar principle to (a) above, but can be used in cases where the requirement of accuracy of temperature control is not as stringent. This type of pulse is called a quasi-static square pulse.

The situation depicted in FIG. 1.c represents a square pulse, where the pulse duration $\Delta t_p$, is much less than the time constant, $\Delta t_{ss}$, for achieving steady-state heat distribution in and around the heat-targeted region. The heat-targeted region experiences only a rapid rise and fall of temperature, without equilibration. This type of pulse is called a dynamic square pulse.

In view of the lack of temperature equilibration in FIG. 1c above, the pulse may be shaped for the purpose of making the instantaneous (elevated) temperature constant with time in the heat-targeted region. Again, the pulse duration $\Delta t_p$, is much less than the time constant, $\Delta t_{ss}$, for equilibration, but here the pulse-shape is designed to achieve a relatively flat time-behavior, except for rapid turn-on and turn-off transients. An example of this situation is depicted in FIG. 1.d, illustrating a dynamic shaped pulse.

In DC/quasi-static and steady-state trimming, one may use relatively long trimming pulses, such as 100 ms and longer, and the heated microstructure may or may not be relatively uniformly and entirely heated by those pulses. If one models the heated microstructure as being uniformly and entirely heated by those pulses, then one can estimate a maximum reasonable power $P_{max}$ for many applications to be $P=IV=I^2R=V^2/R=P_{max}=100$ mW. For example, this could correspond to $R_{heater}=500\Omega$, (relatively low), I=15 mA, V=7.5V, (low enough for many user devices). With these parameters, in order to reach an elevated temperature of 500° C.–700° C., (roughly realistic in the case of thermally-trimmed resistors), the microstructure must have thermal isolation higher than 5–7° K/mW. The numerical analysis above is also valid for the case of a sub-region of the microstructure being heated. The geometry, materials, and layout of the structure must be properly designed to meet this requirement. For example, in a device based on a suspended microstructure, this translates to constraints on such parameters as length and width of supporting bridges, thickness, thermal conductivity of the layers making up the microstructure, depth of the cavity.

In pulse-based trimming within this invention, one uses pulses short enough to heat certain localized areas of a particular microstructure, without affecting nearby areas on the same microstructure (or another nearby microstructure). In order for pulse trimming to be practically effective, again the trimming power must not be too high, for the same user-based restrictions, and there is the added restriction that the thermal conductivity within the microstructure itself must not be too high. This in turn restricts such parameters as the thickness, h, of the microstructure (assuming that it is of generally planar shape). A single trimming pulse having energy $E=P\Delta t$ must heat an area $A_h$ of the suspended microstructure having thickness h, up to above the trimming temperature $T_{trim}$ defined by equation:

$$T_{trim} = \frac{P\Delta t}{c_v \rho(V_h)}.$$

The heated volume $V_h$ can be described as ($A_h$h), where $A_h$ is the effective area of the heated region. Since heat diffusion has characteristic length $L_{hd}=\sqrt{2\chi\Delta t}$ (where thermal diffusivity $\chi=k/\rho c_v$; k is thermal conductivity; $\rho$ is density and $c_v$ is specific heat of the material of the microstructure), the heated area $A_h=(\pi L_{hd}^2+A_R)$, where $A_R$ is the area of the heater resistor. Therefore, if the area of the heater resistor is neglected, $$T_{trim} = \frac{P}{2\pi k h}.$$

Relative to the maximum power $P_{max}$, the thickness of the microstructure h must be comfortably less than:

$$h < \frac{P_{max}}{2\pi k T_{trim}}.$$

For example, if $P_{max}=100$ mW, $T_{trim}=700°$ C. and k=0.014 W/cm·° K (for silicon dioxide), the thickness h must be less than ~17 µm. Practically, thickness h should be less than ~10 µm because (1) the actual size of the heater and trimmed resistor cannot be neglected and (2) the thermal conductivity k for a real (usually multi-layer) structure is normally higher (for example including silicon nitride (k=0.16 W/cm·° K) and polysilicon (k=0.3 W/cm·° K)). Further decrease of h enables the achieving of higher temperatures in the heated area, for a given pulse energy.

Figure 4:
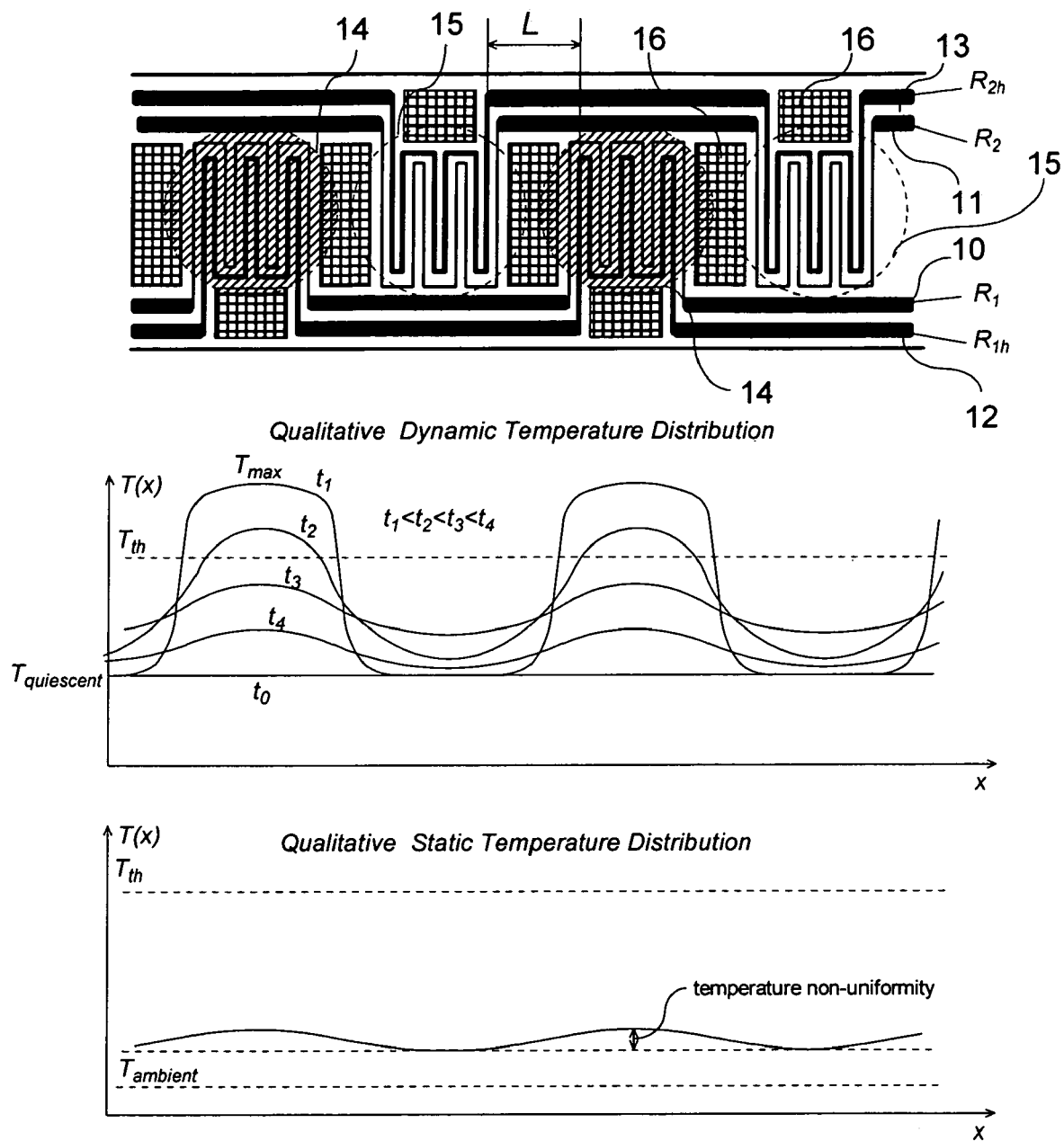
FIG. 4 shows schematically one potential layout of two pairs of functional and heating resistors on the micro-platform with corresponding temperature distributions under transient and static temperature conditions.

One possible configuration of the invented device is shown schematically in FIGS. 2–4. FIG. 2 depicts a two-bridge cantilever 1, serving as a mechanical support for four resistors—two functional resistors $R_1$, $R_2$, and two electrically-heated resistors $R_{1h}$, $R_{2h}$. The resistors are placed on the central area 2 of the cantilever 1. The cantilever 1 is suspended over the cavity 9, etched in a silicon substrate 3, thus thermally isolating the cantilever 1 from the silicon substrate 3, which acts as a heat sink. Electrical connections to the resistors 4, 5, 6, 7, pass through two bridges 8 and enter the non-thermally-isolated region above the silicon substrate 3. FIG. 3 gives a cross-sectional view of the micro-machined structure.

In a preferred embodiment, standard micro-fabrication technology such as CMOS (or BiCMOS, or others), is used to fabricate resistive and dielectric layers to form the cantilever. It is well-known that such dielectric layers as silicon oxide and silicon nitride have low thermal conductivity. Therefore high thermal isolation (approximately 20–50° K/mW) can be achieved for the type of microstructure described here.

Resistors $R_1$, $R_2$, $R_{1h}$ and $R_{2h}$ can be made, for example, from polysilicon having sheet resistance of 20–100Ω/square, which is typical for CMOS technology. It is also known from the prior art that polysilicon resistors can be thermally trimmed by heating them up to temperature higher than a certain threshold $T_{th}$, such as $T_{th} \approx 500°$ C.

A polysilicon resistor having resistance of 10 kΩ (for example) can be readily fabricated in an area of approximately 30 μm×30 μm, if a technological process having 1 μm resolution is used. For a 0.8 μm or 0.35 μm or smaller-feature-sized process, the size of the resistor can be significantly smaller. Therefore all four resistors, two functional with resistance of, for example, 10 kΩ each, and two auxiliary, with preferably lower resistance such as approximately 1 kΩ, can be fabricated on the thermally isolated area 2 with typical area in an approximate range of 500 μm²–20,000 μm², e.g. 50 μm×100 μm. This size is reasonable for many possible applications, and releasing of the whole structure can be done by well-known micro-machining techniques, for example chemical etching in an isotropic etchant solution(s), or isotropic dry silicon etch techniques.

FIG. 4 shows schematically one potential layout of resistors placed on the cantilever 1. Resistors $R_1$, 10, $R_{1h}$ 12 and $R_2$ 11, $R_{2h}$ 13 are embedded and grouped so that the locations of portions of the resistive elements in $R_1/R_{1h}$ and $R_2/R_{2h}$ resistors alternate along the central thermally isolated area 2 of the cantilever 1. A distance L, shown in FIG. 4 separates these resistive portions from each other.

The heater resistors $R_{1h}$ 12 and $R_{2h}$ 13 can be either inside or outside of the functional resistors in the serpentine pattern. FIG. 4 shows the heaters on the inside of the pattern. Many potential layouts are available. In order to help maintain a relatively spatially flat T(x) profile, it may be advantageous to have the heater resistors on the outside (as shown later in FIG. 12.)

The device functions as follows. For simplicity of explanation, before a trimming pulse (at $t_0$), the structure is stabilized at quiescent temperature $T=T_{quiescent}$, as shown in FIG. 4. When a short pulse of voltage (which can be square or shaped), with duration Δt is applied to the resistor $R_{1h}$ 11, a certain amount of heat is injected into the restricted resistive regions 14, shown roughly as diagonally-shaded circles in FIG. 4, corresponding to $R_1$ and $R_{1h}$, while the restricted areas corresponding to $R_2$ and $R_{2h}$ 15, (unshaded circles) remain at or near the quiescent temperature. This situation is represented by the plot T(x) at time $t_1$, (at the end of the pulse), in FIG. 4 (Qualitative Dynamic Temperature Distribution). Quantitatively, the overheating temperature of these particular locations can be estimated as $(T_{max}-T_{quiescent}) \approx (P\Delta t)/C$, where P is dissipated power and C is thermal capacity of the heated location. This approximation is valid only for short-enough pulses (dynamically pulsed cases (c) and (d)). To evaluate preferable pulse duration, the following suggestions can be made. During time $t_T$, heat is transferred along the cantilever to a certain distance L defined by equation: $t_T = L^2/2\chi$ where thermal diffusivity $\chi = k/\rho c_v$; k is thermal conductivity; ρ is density and $c_v$ is specific heat of the material of the cantilever. Therefore, if L is the distance between the heated locations 14, and "cold" locations of the non-trimmed resistor 15, the duration of the pulse Δt should be preferably less than time $t_T$. This means that heating of the resistor $R_1$ 10 is terminated before heat reaches resistor $R_2$ 11. After the end of a pulse, the accumulated heat further spreads over the structure yielding more uniform temperature distributions over time.

Temperature distributions T(x) along the structure at times $t_2<t_3<t_4$, corresponding to this case, are also shown schematically in FIG. 4. The overall temperature is also decreasing toward $T_{quiescent}$, as the heat is transferred away to the ambient and substrate. The important feature of the described trimming cycle is that the temperature at the locations $R_2/R_{2h}$ never exceeds the trimming threshold temperature $T_{th}$. Therefore only resistor $R_1$ 10 is being trimmed. Analogously, resistor $R_2$ 11 can be trimmed independently, without trimming of the resistor $R_1$ 10. Estimation of the trimming process of a polysilicon resistor placed on a cantilever between silicon dioxide layers (which is typical for traditional CMOS technology) and distance L=20 μm between "hot" and "cold" locations, gives an approximate pulse duration Δt less than 0.4 ms (k=0.014 W/cm·° K; ρ=2.19 g/cm³; $c_v$=1.4 J/g·° K for silicon dioxide; (R. S. Muller, T. I. Kamins. Device electronics for integrated circuits John Wiley & Sons Inc. NY, Second Edition, 1986.).

Elements in the prior art (for example D. Feldbaumer, J. Babcock, V. Mercier, C. Chun, Pulse Current Trimming of Polysilicon Resistors, IEEE Trans. Electron Devices, 1995, vol. 42, pp. 689–695), indicates that trimming to decrease resistance is done by short pulses at high temperature, and that trimming to increase resistance (recover) is done by longer heat exposure, at a temperature lower than is needed to decrease the resistance, but higher than the threshold for instability. While the short high-temperature pulses may be readily applied to independently trim one element without affecting the others, the longer exposure needed to increase resistance (recover) may impose restrictions on the independent trimming of one resistor among a plurality on a micro-platform. To resolve this problem, in such cases the following useful algorithm can be outlined: (1) apply long heat exposure at a temperature that increases the resistance, for all trimmable elements on the micro-platform; (2) measure all of the trimmable resistances; (3) use short pulses at high temperature to independently trim each trimmable resistor down to its desired value.

In general, $T_{quiescent}$ can be different from the ambient temperature. For example, the situation where $T_{quiescent}$ is substantially higher than the ambient, but lower than $T_{th}$, may be desirable in some situations, for management of trimming pulse parameters and available voltage restrictions. For example, if $T_{th}$>>200° C. and if $T_{quiescent} \approx 200°$ C., which can be obtained by either DC heating or an appropriate ratio of pulse-width to pulse-period (e.g. ½), then the local overheating would need only to be ($T_{th}$ −200° C.), to initiate trimming. As a result, the trimming pulse amplitudes may be lower than they would need to be if $T_{quiescent}$ were at or near to room temperature.

For many applications, a combination of resistors $R_1$ 10 and $R_2$ 11 may be used as a divider (for example, R-R or R-2R dividers) or a trimmer-potentiometer. The stability of these devices may be made to be very high even if the resistors have a non-zero TCR, as long as they are operating at the same (common) temperature. However, if the two resistors are operated at different dissipated powers (as they often may be), the difference in dissipated electric power may result in different elevated temperatures of the resistors $R_1$ 10 and $R_2$ 11 placed on a microstructure. For example, if the TCR of the resistors is 0.001/° K, a typical value for highly-doped polysilicon, then a temperature imbalance of 0.001° K will give a resistance mismatch of 1 ppm. This effect will be especially important on a device having high thermal isolation, where large temperature imbalances would be likely, even for moderate functional current levels.

To suppress or minimize this effect, distributed alternating packets of resistance are proposed in this invention. Small packets of $R_1/R_{1h}$ and $R_2/R_{2h}$ are alternated at least 2 times in order for the two functional resistors to share the heat dissipated in either one by thermal conductance across the structure. In this case, even when different power densities are dissipated in the two functional resistors, the temperature imbalance of the two resistors is dramatically reduced. This situation is schematically depicted at the bottom of FIG. 4 (Qualitative Static Temperature Distribution), where the temperature non-uniformity is small, and all temperatures are comfortably below $T_{th}$. To improve thermal conductance through the microstructure for better temperature equalization at steady state conditions, additional material 16 with preferably high thermal conductivity and relatively high thermal mass per unit area can be placed near and between the locations of the trimmable functional resistors. Polysilicon, for example, can be used for this purpose because it can withstand high temperature during trimming.

Figure 5:
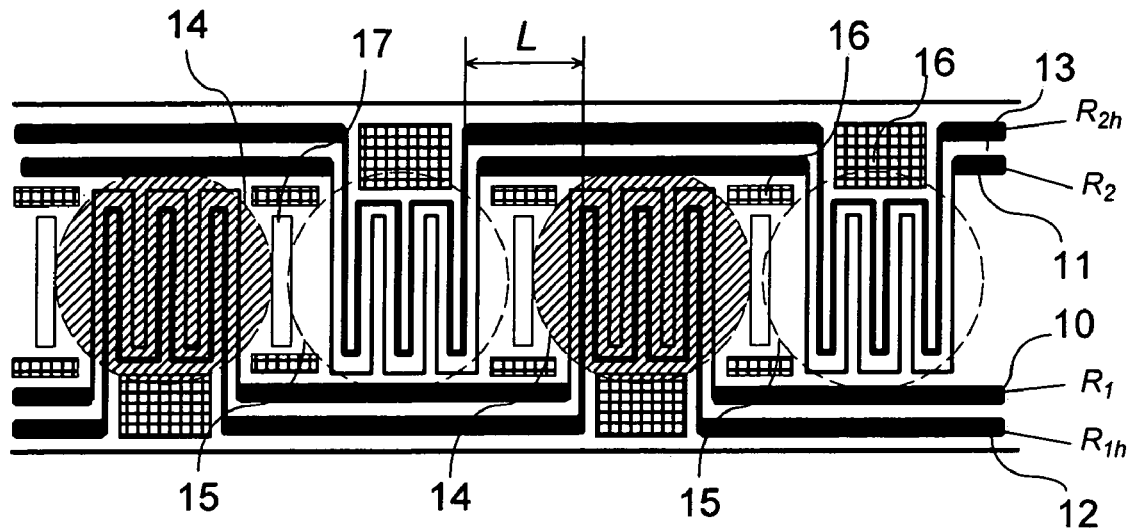
FIG. 5 shows schematically one potential layout of a micro-platform, similar to FIG. 4, with a plurality of slots.

Efficient layout of the invented device must satisfy two constraints/imperatives, which may be partly contradictory: (1) thermal isolation between the resistors $R_1$ 10 and $R_2$ 11 during dynamic heating (trimming) and (2) high thermal equalization between these resistors during operation at slowly-changing or DC dissipated power levels. FIG. 5 shows one possible configuration of the structure. Slots 17 between heated 14 and non-heated areas 15 reduce heat transfer and increase thermal isolation between the resistors $R_1$ 10 and $R_2$ 11 during trimming. During operation at DC or slowly-varying conditions, heat spreads throughout the structure by the paths on both sides of the slots 17. To make this heat transfer more efficient under DC or slowly-varying conditions, additional material 16 with preferably high thermal conductivity is placed on the structure. Usage of these slots allows closer location of two functional resistors that reduces the size of the microstructure and may simplify its fabrication/etching.

In general, the designer of the device can vary layout parameters such as the distance L between trimmed areas 14, width of the microstructure 2, size of the slots 17 size and thickness of elements 16 made from highly thermally-conductive material and level of thermal isolation of the whole microstructure 1 to optimize operation and trimmability of the device.

Figure 6:
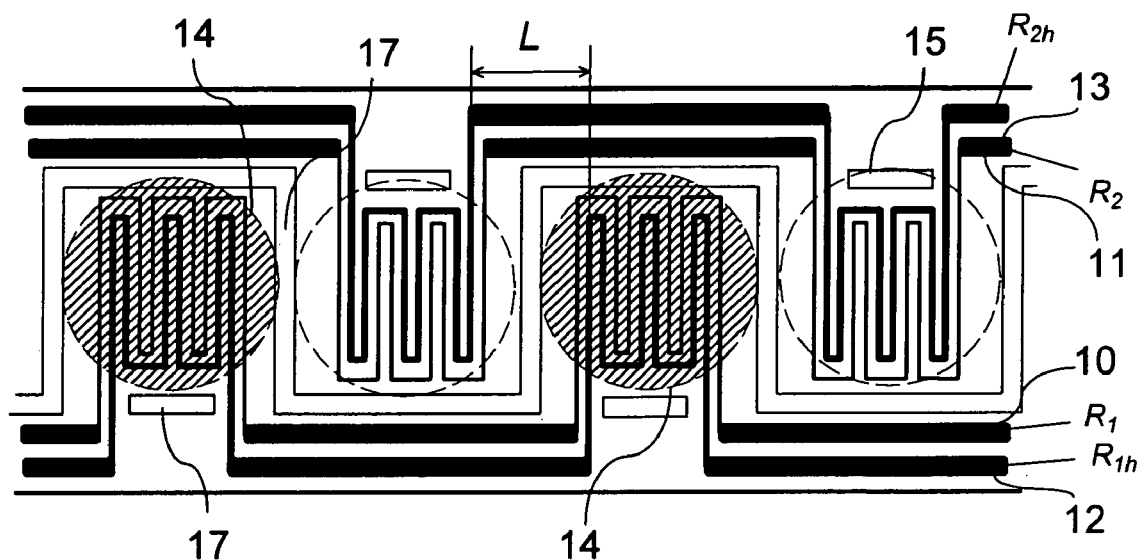
FIG. 6 shows schematically one potential layout of a micro-platform, similar to FIGS. 4, 5, with continuous slots.

FIG. 6 shows schematically an additional embodiment of the heater and trimmed resistor with thermal isolation between trimmed and non-trimmed resistors provided by continuous slots 17.

It is known from prior art that the trimming magnitude $\Delta R_{trim}$ can be quantitatively presented as:

$$\frac{\Delta R_{trim}}{R_0} = F(T_{trim} - T_{th})\phi(t_{trim})$$

where $R_o$ is the initial resistance of the trimmed resistor. Note that functions $F(T_{trim}-T_{th})$ and $\phi(t_{trim})$ are in principle non-linear. For example, as was described in Canadian Microelectronics Corporation Report #IC95-08 September 1995, p. 91, a 30% increase of dissipated power (from 14 mW to 20 mW) in a thermally isolated polysilicon resistor, results in dramatic acceleration of trimming. Understanding and judicious use of this feature of the thermal trimming process is essential for its optimization and reduction of required energy (important in battery-powered applications) (e.g. a subtle rise in delivered power/trimmed temperature) may result in substantially shorter trimming exposure $t_{trim}$. Trimming non-linearity is also important to reach not only fast but also accurate trimming. This feature can be used in such a manner that rough and fast trimming/tuning is done at one trimming temperature at the beginning of tuning. Then, fine and comparatively slow tuning can be done at another (possibly lower) trimming temperature ($T_{trim} > T_{th}$). Furthermore, the direction of trimming (increase vs. decrease) may depend sensitively on T.

The invented concept of dynamic thermal trimming requires short trimming pulses with duration less than the heat propagation time between trimmed and non-trimmed local areas of the microstructure. Pulse width $\Delta t$ is also substantially shorter than the characteristic time required to reach temperature equilibration with the ambient. Therefore typical reaction of the trimmed region to a rectangular voltage pulse may be presented as shown schematically in FIG. 1c. Note that the trimming time is significantly shorter than pulse width. To (1) improve energetic efficiency of trimming by increasing of trimming time during each trimming pulse and (2) provide better control of trimming temperature, trimming pulse with optimized waveform is proposed (see FIG. 1d). At the beginning of the pulse, voltage amplitude is substantially higher than averaged through the pulse to reach trimming temperature quickly. Then voltage amplitude is reduced so that delivered power compensates heat loss due to heat leakage into ambient and maintains trimming temperature at a predetermined value. Temperature control during trimming is important to reach desired rate of trimming and provide rough/fast and fine/slow resistance tuning. Besides reverse trimming described in (D. Feldbaumer, J. Babcock, Theory and Application of Polysilicon Resistor Trimming", Solid-State Electronics, 1995, vol. 38, pp. 1861–1869) in the case of polysilicon, in general, resistor trimming at higher temperatures can be realized only when the trimming temperature is appropriately controlled (as shown in FIG. 1d, not 1c).

Figure 7:
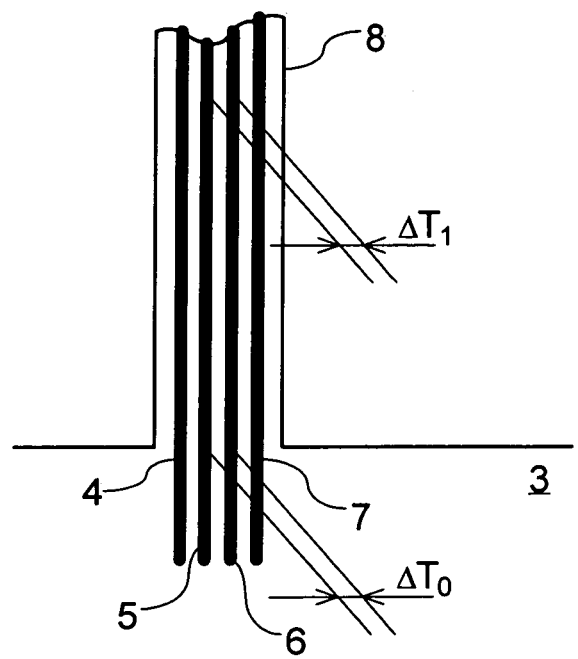
FIG. 7 is a view of the electrical contacts entering one of the bridges of the micro-platform, for immunity to thermal gradients on the substrate.

Another issue raised in the invention is immunity of the balanced resistors $R_1$ 10 and $R_2$ 11 to temperature gradients across the silicon substrate 3, which may result from side heat sources located on the same chip or even outside the chip or its packaging. As was explained before, a difference in operating temperature of the resistors $R_1$ 10 and $R_2$ 11, which may have in general non-zero TCR, results in their imbalance and degrades the long-term stability of the device. This invention provides at least three mechanisms for reduction of the effects of such across-chip temperature gradients. The first mechanism is that Area 2 is thermally isolated from the substrate 3 and therefore has lower sensitivity to temperature gradients across the chip. The second mechanism is that temperature equalization by alternating resistance packets placed on an area. 2, described above further improves insensitivity to across-chip temperature gradients. For the third mechanism, FIG. 7 shows one of the bridges 8, a portion of the microstructure 1. Electrical lines 5 and 6 are connected to the resistors $R_1$ 10 and $R_2$ 11. Temperature differential $\Delta T_o$ at the border of the cavity 9 caused by non-uniform heating of the substrate 3 can be minimized by reducing separation between the two connection lines 5 and 6 to the range of a few microns or less. Moreover, the temperature differential $\Delta T_1$ at a certain distance from the cavity 9 edge will be even smaller than $\Delta T_o$ because of heat transfer across the bridge 8.

Therefore, the placing of two matched resistors $R_1$ 10 and $R_2$ 11 on a thermally isolated microstructure 1 with small spacing between electric contact lines 5 and 6 and alternated location of $R_1/R_{1h}$ and $R_2/R_{2h}$ areas provides substantial immunity to temperature gradients across the substrate 3.

Figure 8:
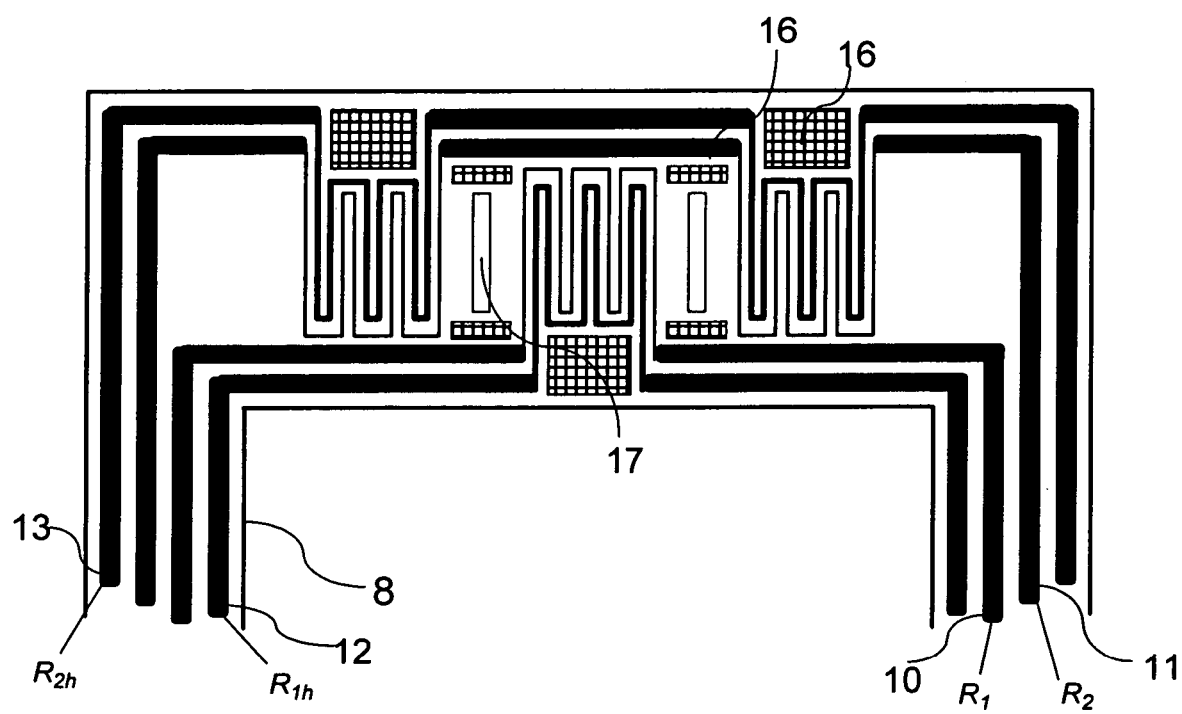
FIG. 8 shows schematically one possible layout of an R-2R divider, arranged on a single micro-platform.

Another method of temperature equalization of the resistors $R_1$ 10 and $R_2$ 11 can be used, if the proportion of dissipated power on each of them during operation is known, for example for an R-2R divider operating with the same current passing through both functional resistors. In this case the resistor with higher dissipated power (2R) can be located on the cantilever so that its thermal isolation from the silicon substrate is less than for the resistor with lower dissipated power (R). As an example, FIG. 8 shows schematically one possible layout of an R-2R divider with the resistor $R_2$ 11 having higher resistance than resistor $R_1$ 10. Resistor $R_2$ 11 is placed near the edges of the cantilever and closer to the silicon substrate than the resistor $R_1$ 10. Therefore its has better thermal contact with silicon substrate. If the power dissipated in the resistor $R_2$ 11 is two times higher than in the resistor $R_1$ 10, and if the layout of the suspended microstructure provides two times higher thermal isolation for the resistor $R_1$ 10 than for the resistor $R_2$ 11, then the elevated temperature of both resistors will be almost the same. Close proximity on the cantilever, as well as the alternating resistive packets, will further help to equalize the operating temperature of two resistors. This approach can be used to provide close operating temperature of two resistors, matched according to some ratio (not necessarily 2:1).

Figure 9:
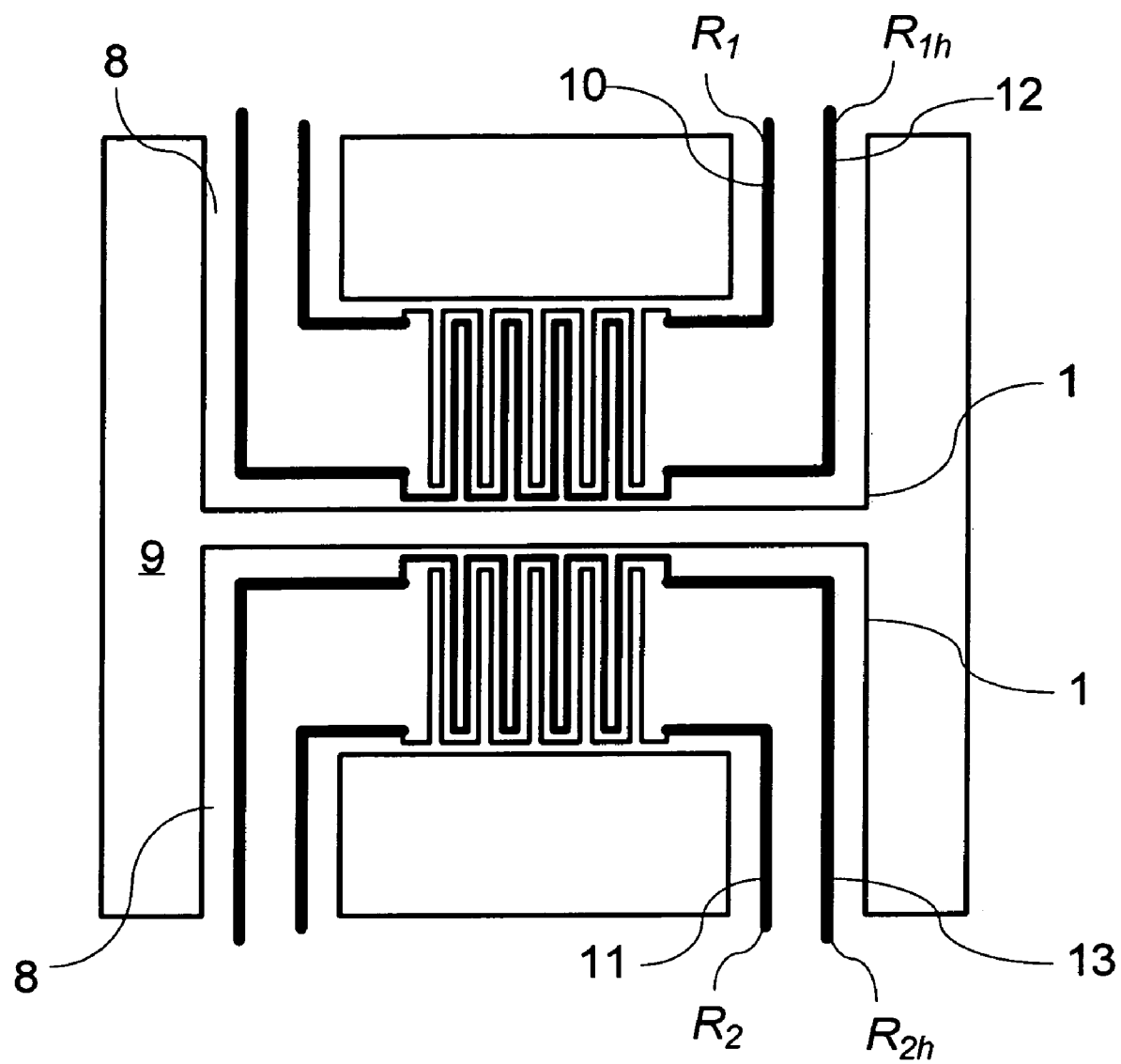
FIG. 9 shows an example of pairs of resistors on separate closely proximal micro-platforms.
Figure 10:
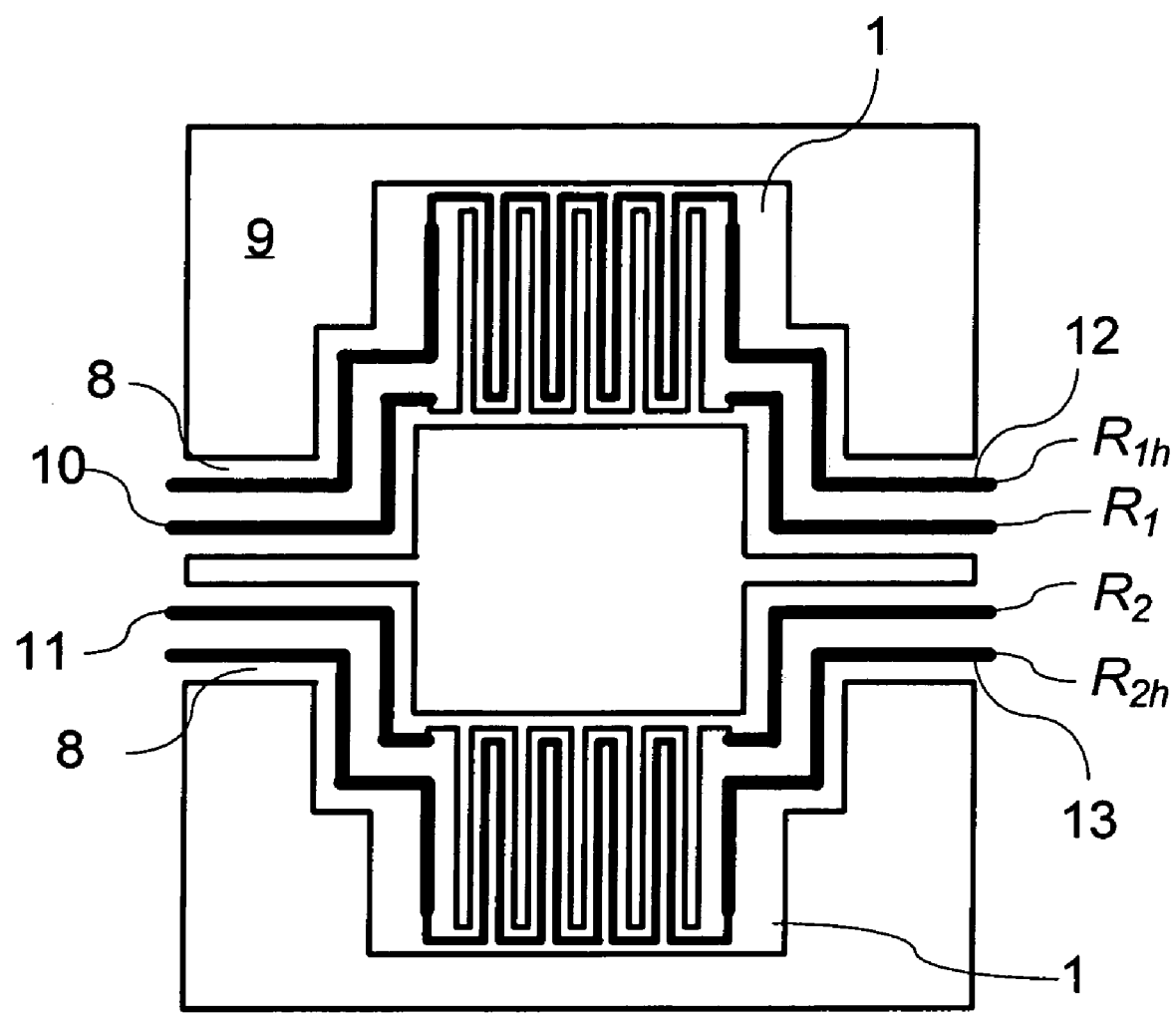
FIG. 10 shows an example of pairs of resistors on separate closely proximal micro-platforms with bridges and connections arranged to be immune to thermal gradients on the substrate.

On the other hand, one can also co-design a pair of micro-platforms to attain closely-matched temperatures during operation. One such alternative layout consists of two resistors located on two different thermally isolated membranes (for example over a common micro-machined cavity). Such a layout may be preferable in some circumstances, for example when both lower trimming power is desired (DC trimming) and simpler requirements to temperature imbalance during operation are applicable. In some circumstances, even placement of the pairs of resistors (where each pair consists of one functional 10, 11 and one heating 12, 13 resistor), on a separate microstructure 1 as shown in FIGS. 9 and 10, may offer certain benefits (may be preferable in some applications). As an example of a benefit: the structure may be trimmable by a DC signal, (without short pulses), simplifying the trimming procedure. The T-stability might not be as good, but might be sufficient for some applications. Two separate microstructures 1 shown in FIGS. 9 and 10 are suspended over the cavity 9 in a semiconductor substrate and have different supporting bridges 8. The difference between these two layouts is that the bridges 8 in the second one (FIG. 10), are placed closer to each other which is preferable, when temperature gradients are induced in the substrate, as has been explained above.

Figure 11:
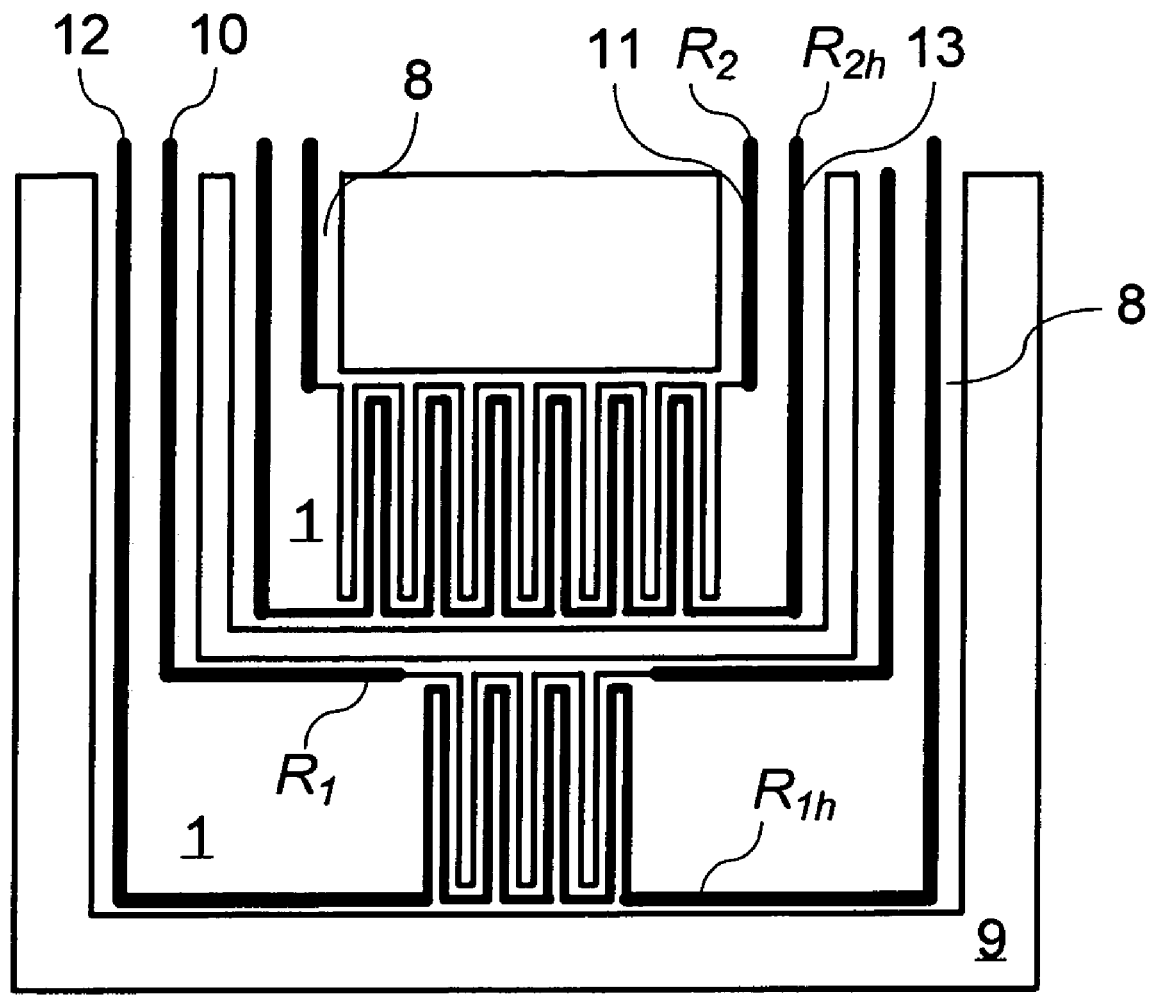
FIG. 11 shows schematically an example of a layout of a trimmable R-2R divider on separate micro-platforms (or single microplatform with continuous slot)

FIG. 11 shows schematically the layout of a trimmable R-2R divider with two pairs of functional 10, 11 and heating 12, 13 resistors placed on separate cantilevers 1 suspended over the cavity 9 in the substrate. If the power dissipated on the resistor $R_2$ 11 (2R) during operation is two times higher than the power dissipated on the resistor $R_1$ 10 (R), the preferable layout should provide thermal isolation of the resistor $R_1$ 10 (R) two times higher than that of the resistor $R_2$ 11 (2R). In this case, the (elevated) temperatures of the two functional resistors would be almost the same, yielding a stable resistor divider, even though the absolute resistance might be varying.

It should be noted that the resistances within the restricted resistive regions need not be side-by-side on the microstructure. Instead, they may be arranged to be one over the other, as long as the electrical insulation between them is sufficient.

As alluded to above, the trimming behavior at temperatures above the trimming threshold may be a complex and sensitive function of T. Thus, for accurate control of trimming in the functional resistor, it is important for the entire functional resistive element being trimmed to be maintained at the same (and controllable) temperature. Thus the spatial T profile, T(x) in the heat-targeted region, should be constant. However, since the heat-targeted element, even in steady state, is intended to be at a higher T than its surroundings, the boundaries of the heat-targeted region will tend to be at a temperature lower than the T at the center. In order to compensate for this, FIGS. 12a, 12b, and 12c show examples of layouts intended to dissipate more power at the edges of the heat-targeted region. More power can be dissipated at the edges of the heat-targeted region by increasing the resistive path around the perimeter, and/or increasing the resistivity of the elements at the perimeter. Since the direction of trimming depends sensitively on temperature, it is preferable to have a major portion of the functional resistor having a flat temperature distribution so that most of the bulk of the resistive element is trimmed in the same direction. Therefore, a power dissipation geometry for the heating element can comprise supplying more heat around the edges of the functional resistor in order to counteract a faster heat dissipation in the edges and resulting temperature gradients across the thermally-isolated micro-platform.

One can place the functional and heating elements on a moveable micro-platform or micro-structure, such that during operation it is in thermal contact with the substrate, to attain lower overheating temperatures and such that during trimming it is thermally isolated (using lower power). FIG. 13 shows one such configuration.

Trimming potentiometer. FIG. 14 shows schematically the electrical connection of two resistors $R_1$ 10 and $R_2$ 11. Their resistance can be thermally trimmed by two electrically isolated heating resistors $R_{1h}$ 12 and $R_{2h}$ 13, as has been explained above. High thermal isolation of the resistors shown in FIGS. 1–12 allows trimming by dissipating electric power as low as 10–30 mW (say, 5V and 2–6 mA). A substantial difference of the proposed trimming potentiometer (trimpot) from digital potentiometers available on the market is the following: While a digital potentiometer allows discrete variation of resistance (usually, not more than 256 steps≈0.4%), the invented trimpot provides continuous tuning with much higher accuracy than 0.4%. For example, two polysilicon resistors in a prototype device manufactured in a standard 1.5 μm CMOS process have been repeatedly thermally trimmed with accuracy of better than 5 ppm ($5 \cdot 10^{-6}$). Their initial imbalance after manufacturing was approximately 1%. The resistance of these polysilicon resistors was found to be trimmed by as much as approximately ±15% of their initial value.

Figure 15:
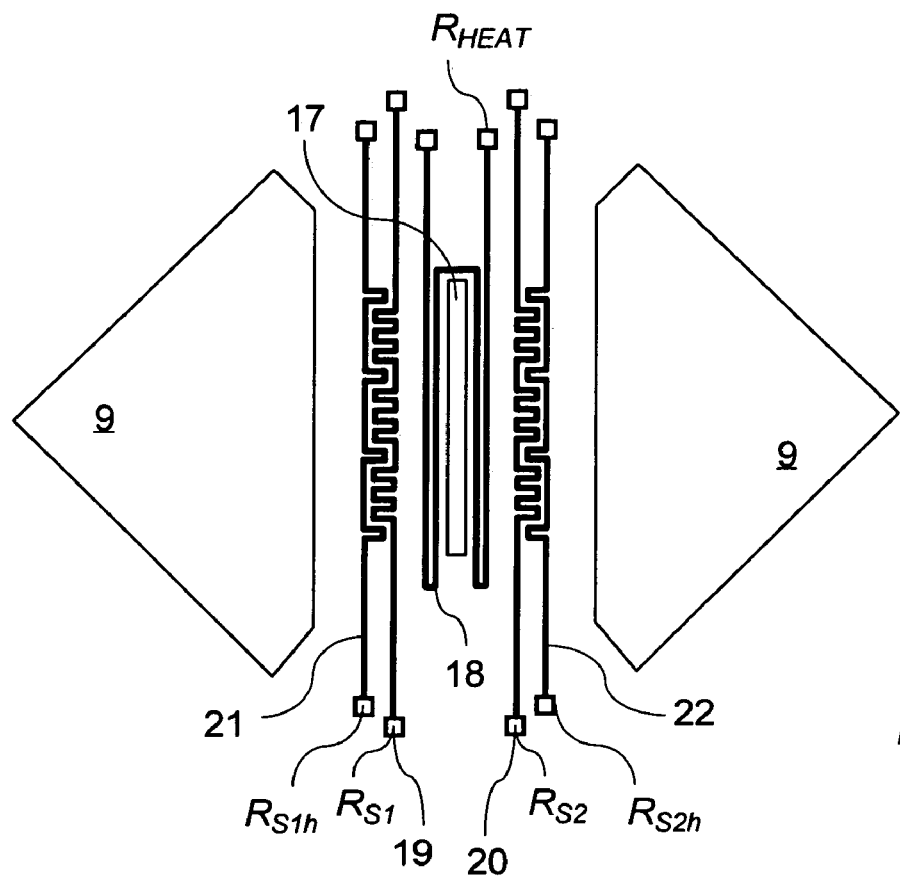
FIG. 15 shows a possible embodiment for a trimmable thermal sensor (e.g. thermo-anemometer or thermal accelerometer), arranged on a single micro-platform with a slot.
Figure 16:
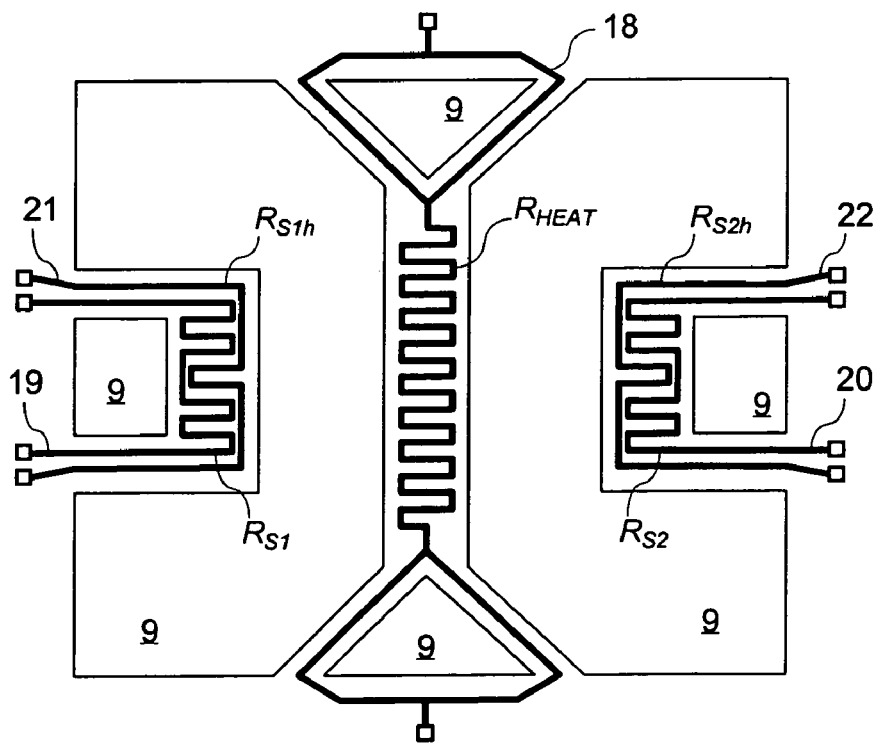
FIG. 16 shows a possible embodiment of a thermal sensor (e.g. thermo-anemometer or thermal accelerometer), arranged on a plurality of micro-platforms.

FIGS. 15 and 16 show schematically two possible embodiments of three-element thermal sensor (e.g. thermo-anemometer, thermal accelerometer), with two functional thermally trimmable temperature-sensitive elements $R_{S1}$ 19 and $R_{S2}$ 20 with accompanying heaters $R_{S1h}$ 21 and $R_{S2h}$. The thermal sensor also contains the functional heater $R_{HEAT}$ 18 placed between two temperature-sensitive elements 19 and 20. All functional elements 18, 19, 20 and auxiliary heaters 21 and 22 which may be manufactured, for example, from polysilicon, are disposed on one thermally isolated platform (FIG. 15) analogous to those described in U.S. Pat. No. 4,478,077. Modification of the shapes of openings to the cavity 9 and slot 17 (top view) transforms one platform into three separate ones shown on FIG. 16 with better mutual thermal isolation of functional elements. For both structures shown on FIGS. 15 and 16, the disclosed method of trimming of functional resistors $R_{S1}$ 19, $R_{S2}$ 20 can be applied. Note that higher mutual thermal isolation of functional resistors in the second structure (FIG. 16) may not guarantee unwanted trimming of the central heater $R_{HEAT}$ 18 during the trimming of one of the resistors $R_{S1}$ 19 or $R_{S2}$ 20. Therefore the same considerations (precautions) must be taken in choosing of the parameters of the pulsed thermal trimming process.

In general, this invention is applicable to any existing trimming process done by a manufacturer in a variety of electronic devices, where these resistors are used as functional elements. For example, such trimmed resistors may be used in analog-to-digital converters, digital-to-analog converters, reference voltage sources, operational and instrumentation amplifiers, resistor networks and other devices. The accuracy of trimming can be very high, exceeding accuracy given by laser trimming. In addition, the realization of the invented technique does not require special equipment (powerful laser) and can be easily automated using common electrical equipment such as voltage sources and controllers. Trimmable resistors can be manufactured in a standard CMOS (or BiCMOS) process that allows their integration in integrated circuits.

In addition to the above well-known possible applications known from the prior art, the invented trimming technique can be used in a new "user-oriented" group of applications, characterized by low electric voltage and power required to initiate trimming. This enables various levels of user to perform trimming of electronic components. This could be during assembly of complex electronic systems (tuning, adjustment, regulation of voltage offset and amplification, etc.), and manually and/or automatically initiated during operation of a system to provide adaptive regulation/tuning.

Offset voltages in operational and instrumentation amplifiers typically result from variations of ambient temperature, varying temperature gradients, aging effects and other reasons, causing imbalance of the input cascade of the amplifier. Note that turning the amplifier on results in its self-heating and inevitable drift of offset voltage during period of time from tens of seconds to several minutes. Balancing of the amplifier by an external trimpot helps to reduce offset voltage but cannot eliminate its drift during operation. Use of the invented thermally activated trimpot (as an integrated part of the amplifier or as a separate component electrically connected to the amplifier) allows automatic adaptive regulation of offset voltage. One possible algorithm for this balancing consists of, (1) the input of the amplifier must be temporarily disconnected from the input voltage source; (2) zero voltage should be applied to input; (3) output voltage is measured, (4) thermal trimming is activated to minimize offset output voltage; (5) input signal is fed to the amplifier again. The difference between this invented offset voltage regulation and the use of a chopper amplifier is that in this invention this chopping-like scheme needs only to be activated for short periods of time, allowing the amplifier to function in a non-chopped manner for the rest of the time. In this case, the usual continual noise induced by chopping is not present. In this case, one achieves the benefit of near-zero-offset operation, without the noise penalty of the chopping. Such a scheme can be used in conjunction with an on-board T-sensor, allowing intelligent management of trimming events: frequent trimming need only be initiated during periods of rapid temperature change, such as at turn-on, or any other case of rapidly-changing environment (such as the user pulling the cell phone out of the pocket outdoors during winter).

The invented technique can be used in amplifiers with programmable gain. In currently typical amplifiers, gain is regulated in a discrete manner by switching of appropriate resistors in an array. Thermally trimmed resistors would allow continuous tuning of gain.

If functional resistors $R_1$ 10 and $R_2$ 11 (and perhaps more resistors) are sensing elements in a sensor, and the sensor output signal essentially depends on their resistance, the invented trimming technique can be applied. For example, thermally trimmed resistors can be a part of thermo-anemometers or thermal accelerometers or pressure sensors, such as in FIGS. 15, 16. This method can be used to trim devices and structures similar to those variations described in U.S. Pat. Nos. 4,472,239 and 4,478,076. Those micromachined structures contain a plurality of thermo-resistors placed on a suspended thermally-isolated plate having various configurations of slots and openings. The resistors in those and similar sensors and layouts could be altered, to be made from a material suitable for the trimming inventions herein, (for example, from polysilicon or other materials which allow thermal trimming). In this case, the methods (dynamic square- and shaped-pulses) invented herein would allow selective trimming of (a) certain thermo-resistor(s) without affecting others.

A variety of levels of performance and result would be available: (1) Pulsed trimming of a particular resistor by directly applying an electric signal to the resistor itself. One would need to beware that the heating of the particular resistor did not unbalance a closely adjacent resistor (for example, since the adjacent resistor might be the resistor which provides the heat for operation of the thermal sensor (for example, thermo-anemometer), whose performance relies on the symmetry of its heat dissipation). (2) One may increase the width of slots and/or separation of the thermo-resistors, to attain better mutual thermal isolation between the thermo-resistors, making longer pulses useable for trimming. This may reduce to very large separations or slots, (which may be equivalent to placing the resistors on separate micro-platforms), or may take the form of actually placing the thermo-resistors on separate micro-platforms, and trimming them separately. (3) One may incorporate separate heating elements for heating of the targeted thermo-resistors as described above in this invention, allowing trimming under a wider range of conditions. Electrically isolated heating resistors like $R_{1h}$ 12 and $R_{2h}$ 13 (or more) can be used for trimming as was explained before. In general, depending on mutual thermal isolation, one varies the pulse duration and shape. Also in general, the preferable layout of the resistors should provide an overall high level of thermal isolation to reduce electric power required for trimming and selective trimming.

Usage of the invented technique in sensor applications allows adaptive tuning/balancing of the sensor during operation, which can be done automatically. For example, periodic balancing (offset regulation) of a thermoanemometer-type flow sensor in a mass-flow controller can be done during operation when gas/liquid flow is interrupted for a short period of time. The same approach can be implemented in other sensor-based systems if zero input signal can be applied to the sensor for a certain period of time.

Sensors containing thermally trimmed resistors and sensor modules (containing sensors and accompanying electronics) can be tuned using the invented technique, by a sensor manufacturer or system manufacturer. In this case, manually adjusted and potentially unreliable mechanical potentiometers can be eliminated.

The concept of a precision resistor with near-zero TCR consisting of two parts with negative and positive TCR is known from prior art (U.S. Pat. No. 6,097,276). Manufacturing of such a resistor includes several stages of laser trimming of both resistive parts with subsequent measurement of resistance at different temperatures. The invented thermal trimming technique can be applied to substitute laser trimming, improve accuracy of matching of two resistive parts and simplify manufacturing processes. In accordance with a general concept, a precision resistor contains two functional resistors $R_1$ 10 and $R_2$ 11 and two heating resistors $R_{1h}$ 12 and $R_{2h}$ 13 placed on thermally isolated supporting mechanical microstructures as described above. One of the functional resistors, say, $R_1$ 10 has positive TCR and another, $R_2$ 11, has negative TCR. Types of material of these resistors are not specified but as an example, polysilicon can be used for this purpose. It is known that TCR of polysilicon depends on doping and can be positive (approximately $+10/^{-3}/^\circ$ K) at high doping level and negative (from $-10^{-4}/^\circ$ K to several $-10^{-3}/^\circ$ K) at low doping. Therefore thermal trimming of two resistors can be done so to provide target value of total resistance and zero total TCR. It should be noted that periodic heating of the resistor required to measure its TCR during manufacturing process before and after trimming does not require external heat sources (hot plates or ovens) and can be done by heating resistors $R_{1h}$ 12 and $R_{2h}$ 13. Obviously, the elevated temperature in this case should be much lower than for thermal trimming purposes. An additional convenience of usage of heating resistors $R_{1h}$ 12 and $R_{2h}$ 13 is that heating and cooling can be performed very fast, with typical time of 20–50 ms defined by thermal inertia of the microstructure. Note that the same heating and trimming could be provided from another heat source, such as a laser, or self-heating of the functional resistor itself. In these cases also, the heating and cooling times will be determined by the thermal inertia of the micro-platform, as discussed above. Therefore the whole manufacturing process can be substantially faster. For many applications, accurate knowledge of temperature behavior of TCR is required, including terms of higher-order variation with temperature. This requires measurement at a plurality of elevated temperatures. As another example, one could self-heat a functional resistor up to a known relatively high temperature (still substantially below the trimming temperature), and then measure its resistance several known times as it cooled to room temperature at known cooling rate. The invented technique allows also reduction of number of rejected resistors and improves technological yield because thermal trimming may be reversible. Usage of CMOS-compatible materials such as polysilicon with different doping levels allows integration of such precision resistors in integrated circuits.

More generally, the placing of functional elements on thermally-isolated micro-platforms having small thermal mass, allows the acceleration of the process of measurement of its physical parameters, if these measurements require measurement at one or more elevated temperatures (of course, still well below the thresholds for trimming or recovery). Note that these measurements can be used in many processes of calibration or trimming.

It will be understood that numerous modifications thereto will appear to those skilled in the art. Accordingly, the above description and accompanying drawings should be taken as illustrative of the invention and not in a limiting sense. It will further be understood that it is intended to cover any variations, uses, or adaptations of the invention following, in general, the principles of the invention and including such departures from the present disclosure as come within known or customary practice within the art to which the invention pertains and as may be applied to the essential features herein before set forth, and as follows in the scope of the appended claims.

The invention claimed is:

1. A circuit for trimming a resistor, the circuit comprising:
   a thermally-isolated micro-platform suspended over a cavity on a substrate;
   a plurality of thermally-trimmable resistors spaced apart on the thermally-isolated micro-platform; and
   trimming circuitry for subjecting a portion of the thermally-isolated micro-platform to heat pulses for thermal trimming such that a resistance value of one of said plurality of thermally-trimmable resistors is trimmed while a resistance value of remaining ones of said plurality of thermally-trimmable resistors remains substantially untrimmed.

2. A circuit as claimed in claim 1, wherein said trimming circuitry comprises circuitry for passing a signal through said one of said plurality of thermally-trimmable resistors.

3. A circuit as claimed in claim 1, wherein said trimming circuitry comprises at least one heating resistor on said micro-platform for receiving a signal and trimming said one of said plurality of thermally-trimmable resistors.

4. A circuit as claimed in claim 3, wherein each of said at least one heating resistor traces at least one of said plurality of thermally-trimmable resistors.

5. A circuit as claimed in claim 4, wherein a first pair of thermally-trimmable resistor and heating resistor is grouped and embedded with a second pair of thermally-trimmable resistor and heating element so that locations of portions of said first pair and said second pair alternate on said thermally-isolated micro-platform.

6. A circuit as claimed in claim 5, wherein said portions of said first pair and said second pair are separated by slots in said thermally-isolated micro-platform, thereby reducing heat transfer and increasing thermal isolation between said first pair and said second pair.

7. A circuit as claimed in claim 6, wherein said slots are continuous.

8. A circuit as claimed in claim 1, wherein said trimming circuitry comprises circuitry for transmitting a plurality of electrical pulses and measuring said resistance value of one of said plurality of thermally-trimmable resistors in between each of said plurality of electrical pulses to determine whether a target resistance value has been obtained.

9. A circuit as claimed in claim 1, wherein said trimming circuitry comprises circuitry for transmitting dynamically-shaped pulses to achieve substantially constant temperature as a function of time during a trimming pulse.

10. A circuit for trimming a resistor, the circuit comprising:
a thermally-trimmable resistor on a substrate subject to a heat source having A power dissipation geometry adapted to obtain a substantially constant temperature distribution across said thermally-trimmable resistor by dissipating more power at the boundaries of a heat-targeted region where there is greater heat loss, when a temperature of said thermally-trimmable resistor is raised for trimming purposes; and
trimming circuitry for trimming the thermally-trimmable resistor.

11. A circuit as claimed in claim 10, further comprising a thermally-isolated micro-platform on said substrate, and wherein said thermally-trimmable resistor is on said thermally-isolated micro-platform.

12. A circuit as claimed in claim 11, wherein said heat source comprises a heating resistor on said thermally-isolated micro-platform in close proximity to said thermally-trimmable resistor, and wherein said trimming circuitry comprises circuitry for passing a signal through said heating resistor to trim said thermally-trimmable resistor.

13. A circuit as claimed in claim 11, wherein said power dissipation geometry comprises a heater path that encircles the thermally-trimmable resistor.

14. A circuit as claimed in claim 11, wherein said power dissipation geometry further comprises a heater path that provides more heat to edges of the thermally-trimmable resistor and resulting temperature gradients across the at least one thermally-isolated micro-platform.

15. A circuit as claimed in claim 11, wherein said power dissipation geometry comprises a heater path that substantially encloses said thermally-trimmable resistor with said heating resistor.

16. A circuit as claimed in any one of claims 11, wherein said power dissipation geometry further comprises an increased density of resistive lines near locations where there is greater heat loss to compensate for the heat loss.

17. A circuit as claimed in claim 11, wherein said trimming circuitry for heating comprises circuitry for transmitting a plurality of electrical pulses and measuring said resistance value of one of said plurality of thermally-trimmable resistors in between each of said plurality of electrical pulses to determine whether a target resistance value has been obtained.

18. A circuit as claimed In claim 11, wherein said trimming circuitry for heating comprises circuitry for transmitting dynamically-shaped pulses to achieve substantially constant temperature as a function of time during a trimming pulse.

* * * * *